(12) United States Patent
Nakagawa et al.

(10) Patent No.: US 8,030,694 B2
(45) Date of Patent: Oct. 4, 2011

(54) DIELECTRIC FILM AND SEMICONDUCTOR DEVICE USING DIELECTRIC FILM INCLUDING HAFNIUM, ALUMINUM OR SILICON, NITROGEN, AND OXYGEN

(75) Inventors: Takashi Nakagawa, Hachioji (JP); Naomu Kitano, Machida (JP); Toru Tatsumi, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/760,084

(22) Filed: Apr. 14, 2010

(65) Prior Publication Data
US 2010/0244192 A1   Sep. 30, 2010

Related U.S. Application Data

(63) Continuation of application No. PCT/JP2009/065305, filed on Sep. 2, 2009.

(30) Foreign Application Priority Data

Oct. 31, 2008 (JP) .................................. 2008-282100

(51) Int. Cl.
*H01L 29/76* (2006.01)
*H01L 29/47* (2006.01)
*H01L 29/812* (2006.01)
*H01L 31/07* (2006.01)
*H01L 31/108* (2006.01)
*H01L 29/792* (2006.01)

(52) U.S. Cl. ........................................ 257/295; 257/324
(58) Field of Classification Search .................. 257/295, 257/324, E29.162
See application file for complete search history.

(56) References Cited

U.S. PATENT DOCUMENTS

| 6,903,398 | B2 | 6/2005 | Yamamoto | 257/295 |
|---|---|---|---|---|
| 7,125,765 | B2 | 10/2006 | Yamamoto | 438/240 |
| 7,183,604 | B2 | 2/2007 | Cartier et al. | 257/310 |
| 7,307,303 | B2 | 12/2007 | Yamamoto | 257/295 |
| 7,410,812 | B2 | 8/2008 | Yamaguchi | 438/3 |
| 7,524,723 | B2 | 4/2009 | Yamamoto | 438/240 |
| 7,547,952 | B2 | 6/2009 | Metzner et al. | 257/411 |
| 7,605,436 | B2 | 10/2009 | Yamaguchi | 257/410 |

(Continued)

FOREIGN PATENT DOCUMENTS

JP       2004-161602 A      6/2004

(Continued)

OTHER PUBLICATIONS

Sivasubramani, P., et al., "Effect of Composition on the Thermal Stability of Sputter Deposited Hafnium Aluminate and Nitrided Hafnium Aluminate Dielectrics on Si (100)," Journal of Applied Physics, vol. 101, No. 11, p. 114108 (2007).

(Continued)

*Primary Examiner* — William M. Brewster
(74) *Attorney, Agent, or Firm* — Fitzpatrick, Cella, Harper & Scinto

(57) ABSTRACT

The present invention provides a dielectric film having a high permittivity and a high heat resistance. An embodiment of the present invention is a dielectric film (103) including a composite oxynitride containing an element A made of Hf, an element B made of Al or Si, and N and O, wherein mole fractions of the element A, the element B, and N expressed as B/(A+B+N) range from 0.015 to 0.095 and N/(A+B+N) equals or exceeds 0.045, and has a crystalline structure.

17 Claims, 17 Drawing Sheets

U.S. PATENT DOCUMENTS

| | | | |
|---|---|---|---|
| 2004/0198069 A1 | 10/2004 | Metzner et al. | 438/785 |
| 2005/0202222 A1 | 9/2005 | Cartier et al. | 428/209 |
| 2006/0208215 A1* | 9/2006 | Metzner et al. | 252/62.3 BT |
| 2008/0169520 A1 | 7/2008 | Kiyomura et al. | 257/411 |
| 2008/0197429 A1 | 8/2008 | Sato et al. | 257/412 |
| 2008/0237688 A1 | 10/2008 | Yasuda | 257/316 |
| 2008/0264775 A1 | 10/2008 | Kitano et al. | 204/192.1 |
| 2009/0004881 A1* | 1/2009 | Chen | 438/763 |
| 2009/0170340 A1 | 7/2009 | Kitagawa et al. | 438/766 |
| 2009/0170341 A1 | 7/2009 | Kitano et al. | 438/770 |
| 2009/0170344 A1 | 7/2009 | Fukuchi et al. | 438/785 |
| 2010/0024732 A1* | 2/2010 | Mokhlesi et al. | 118/724 |
| 2010/0120238 A1 | 5/2010 | Kitano et al. | 438/586 |
| 2010/0133092 A1 | 6/2010 | Mashimo et al. | 204/192.21 |

FOREIGN PATENT DOCUMENTS

| | | |
|---|---|---|
| JP | 2004-214304 A | 7/2004 |
| JP | 2005-025995 A | 1/2005 |
| JP | 2006-135084 A | 5/2006 |
| JP | 2008-198982 A | 8/2008 |
| JP | 2008-205065 A | 9/2008 |
| JP | 2008-244163 A | 10/2008 |
| WO | WO 2004/084291 A1 | 9/2004 |
| WO | WO 2004/094691 A1 | 11/2004 |

OTHER PUBLICATIONS

Koyama, M., et al., "Effect of Film Composition of Nitrogen Incorporated Hafnium Aluminate (HfAlON) Gate Dielectric on Structural Transformation and Electrical Properties through High-Temperature Annealing," Japanese Journal of Applied Physics, vol. 43, No. 4B, pp. 1788-1794 (2004).

Pant, G., et al., "Comparison of Electrical and Chemical Characteristics of Ultrathin HfON Versus HfSiON Dielectrics," Applied Physics Letters, vol. 89, p. 032904 (2006).

Kita, K., et al., "Permittivity Increase of Yttrium-Doped $HfO_2$ Through Structural Phase Transformation," Applied Physics Letters, vol. 86, p. 102906 (2005).

Toriumi, A., et al., "Materials Science-Based Device Performance Engineering for Metal Gate High-k CMOS," International Electron Devices Meeting Technical Digest, pp. 52-56 (2007).

Migita, S., et al., "Design and Demonstration of Very High-k (k~50) $HfO_2$ for Ultra-Scaled Si CMOS," Symposium on VLSI Technology Digest of Technical Papers, pp. 152-153 (2008).

Koyama, M., et al., "Cubic-HfN Formation in Hf-Based High-k Gate Dielectrics with N Incorporation and Its Impact on Electrical Properties of Films," Japanese Journal of Applied Physics, vol. 44, No. 4B, pp. 2311-2315 (2005).

* cited by examiner

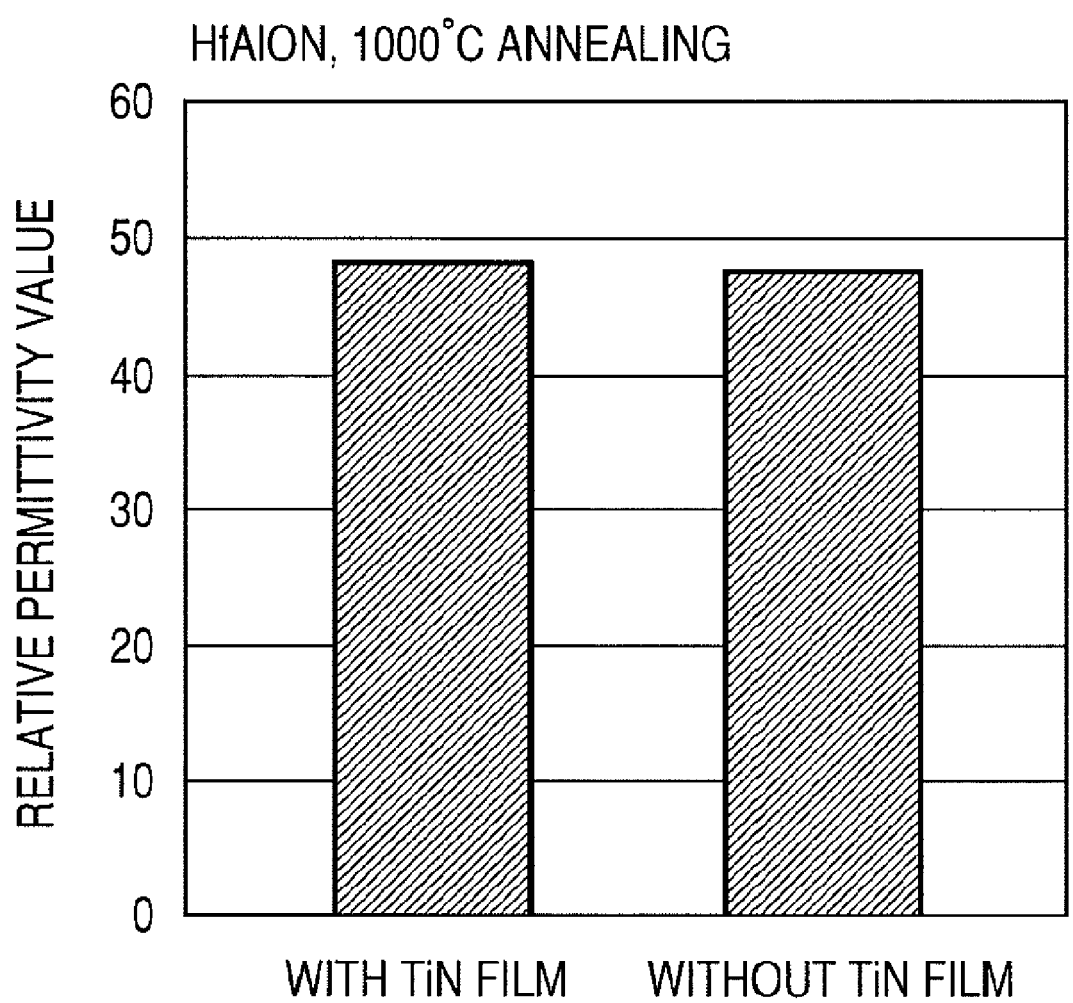

HfAlON
RMS:0.145nm

HfO$_2$
RMS:0.368nm

PROCESS 11

US 8,030,694 B2

DIELECTRIC FILM AND SEMICONDUCTOR DEVICE USING DIELECTRIC FILM INCLUDING HAFNIUM, ALUMINUM OR SILICON, NITROGEN, AND OXYGEN

CROSS-REFERENCES TO RELATED APPLICATIONS

This application is a continuation application of International Application No. PCT/JP2009/065305, filed on Sep. 2, 2009, the entire contents of which are incorporated by reference herein.

This application also claims the benefit of priority from Japanese Patent Application No. 2008-282100 filed Oct. 31, 2008, the entire contents of which are incorporated herein by reference.

TECHNICAL FIELD

The present invention relates to a dielectric film and a semiconductor device using a dielectric film.

BACKGROUND ART

Developments in semiconductor devices are accompanied by increasingly higher degrees of element integration, resulting in increased miniaturization of each element and a reduction in operating voltage. For example, in the field of MONOS (metal oxide nitride oxide semiconductor)-type non-volatile semiconductor devices which include a blocking film that separates a charge retaining layer and a gate electrode, the miniaturization of elements has led to demands for higher permittivity in blocking films. Similarly, in the field of FG (floating gate)-type non-volatile semiconductor devices, the miniaturization of elements has led to demands for higher permittivity in insulating films between a floating electrode and a gate electrode. In addition, in the field of advanced DRAM (dynamic random access memory) devices, in order to secure capacitance of capacitors making up miniaturized memory cells, dielectric film are required which have high permittivity and are capable of accommodating a thinner film thickness without causing an increase in leakage current. Furthermore, in the field of advanced CMOS device development, techniques for reducing gate leakage current by increasing the physical thickness of a gate insulating film using high permittivity material are being considered. Moreover, it is required that high dielectric films are heat-resistant with respect to a 1000° C.-annealing treatment performed during the manufacturing process of the semiconductor devices described above. Furthermore, it is required that the surfaces of high dielectric films have superior flatness for the purpose of suppressing variations in the operating voltages of the semiconductor devices.

As means for increasing the relative permittivity of a dielectric film, the use of $HfO_2$, $ZrO_2$, and $Al_2O_3$ as dielectric films having a higher relative permittivity than conventional $SiO_2$ film, SiN film, or SiON film combining the two, is being considered. In addition, more recently, research is being performed on dielectric films in which a metallic element is doped on a laminated (stacked) structure made of $HfO_2$, $ZrO_2$, or $Al_2O_3$ or on $HfO_2$ or $ZrO_2$ for the purpose of suppressing leakage current associated with thinner dielectric films.

For example, Non-Patent Documents 1 and 2 disclose dielectric films in which silicon (Si), yttrium (Y), lanthanum (La), or the like is doped as a metallic element on $HfO_2$. According to Non-Patent Document 1 and 2, it is described that, by doping the metallic element described above on $HfO_2$ and performing crystallization thereon, $HfO_2$ having a tetragonal crystalline phase is formed and a high relative permittivity value of 28 is obtained.

Non-Patent Document 3 discloses a dielectric film in which TiN is laminated (stacked) on the surface of $HfO_2$. According to Non-Patent Document 3, it is described that, when crystallization is performed in a state where TiN is laminated on $HfO_2$, $HfO_2$ having a cubic crystalline phase is formed and a high relative permittivity value of 50 is obtained.

Patent Document 1 discloses a dielectric film in which a metallic element such as yttrium (Y), magnesium (Mg), calcium (Ca), or lanthanum (La) and nitrogen are doped on $HfO_2$. According to Patent Document 1, it is described that, by adding an element with a large atomic radius such as Y, Mg and Ca described above to monoclinic $HfO_2$, the aggregated energy of the cubical crystals decreases and stabilizes, thereby altering the crystalline system of $HfO_2$ from monoclinic crystal to tetragonal crystal and then to cubical crystal. As a result, a high dielectric film made of HfYO with a relative permittivity of 70 can be obtained. In addition, as oxygen in the monoclinic $HfO_2$ is replaced with nitrogen, the crystalline system changes from monoclinic crystal to tetragonal crystal, to rhombohedral crystal, and then to cubical crystal as the amount of nitrogen increases.

Patent Document 2 discloses a technique for using, as a dielectric film material, a composition including $HfO_2$ having a cubic crystalline phase and a second compound. According to Patent Document 2, it is described that a $HfO_2$ cubical crystal containing 1 mol % to 50 mol % of $Al_2O_3$ as the second compound has a relative permittivity of 29.8, which is higher than pure $HfO_2$.

Patent Document 3 discloses, as a dielectric film, a noncrystalline film in which noncrystalline aluminum oxide is contained in a crystalline dielectric film and which is formed of $AlM_{(1-x)}O_y$, (where M is a metal such as Hf and Zr capable of forming a crystalline dielectric body) having a composition expressed as 0.05 <x<0.3. According to Patent Document 3, it is described that a high relative permittivity ranging from 25 to 28 can be obtained with noncrystalline zircon aluminate.

Non-Patent Document 4 discloses a dielectric film material made of HfAlON. According to Non-Patent Document 4, it is described that HfAlON whose Hf/(Hf+Al) composition ranges from 20% to 80% and whose nitrogen composition is 30% or higher acquires a noncrystalline structure at an annealing temperature of 850° C. and has a relative permittivity ranging from 10 to 25.

Patent Documents

Patent Document 1: Japanese Patent Application Laid-Open No. 2005-25995

Patent Document 2: Japanese Patent Application Laid-Open No. 2004-161602

Patent Document 3: Japanese Patent Application Laid-Open No. 2004-214304

Non-Patent Documents

Non-Patent Document 1: Applied Physics Letters 86, 102906, 2005

Non-Patent Document 2: International Electron Devices Meeting Technical Digest, 2007, p. 53

Non-Patent Document 3: Symposium on VLSI Technology Digest of Technical Papers, 2008, p. 152

Non-Patent Document 4: Japanese Journal of Applied Physics Vol. 44, No. 4B, 2005, p. 2311

DISCLOSURE OF THE INVENTION

However, the techniques described above respectively have the following problems.

With the technique described in Non-Patent Documents 1 and 2 in which yttrium (Y), silicon (Si), lanthanum (La) or the like is doped as a metallic element on $HfO_2$, it is shown that while an annealing treatment at 800° C. achieves crystallization and a higher permittivity at a relative permittivity of 30, relative permittivity drops to 20 or lower when an annealing treatment is performed at 1000° C. Therefore, $HfO_2$ doped with Y, Si, or La is problematic in its lack of heat resistance with respect to an annealing treatment at 1000° C.

With the technique described in Non-Patent Document 3 in which $HfO_2$ is crystallized in a state where TiN is laminated thereon to form $HfO_2$ having cubical crystals, it is shown that while a relative permittivity value of 50 is obtained by an annealing treatment at 700° C. to 800° C., relative permittivity drops to 30 or lower with an annealing treatment at 800° C. or higher. Therefore, cubic $HfO_2$ formed of a laminated film of TiN and $HfO_2$ also problematically lacks heat resistance with respect to an annealing treatment at 1000° C.

With the dielectric film described in Patent Document 1 in which $HfO_2$ is doped with a metallic element with a large atomic radius such as yttrium (Y), magnesium (Mg), lanthanum (La) and the like and nitrogen, while a relative permittivity value of 70 is obtained through an annealing treatment at 800° C., it is unclear what kind of relative permittivity value can be obtained when crystallization is performed by annealing at 1000° C.

With the technique described in Patent Document 2 in which $HfO_2$ is doped with Al ranging from 1% to 50% to form a cubic crystalline-phase $HfO_2$, while a heat resistance with respect to 1200° C. is described, a relative permittivity value thereof of 29.8 is lower compared to $HfO_2$ in Non-Patent Document 3 and Patent Document 1. Therefore, there is a problem in that a high relative permittivity cannot be obtained. In addition, Patent Document 2 problematically does not describe an optimum Al concentration.

With the technique described in Patent Document 3 in which Al is doped in a range from 5% to 30% into $ZrO_2$ to change $ZrO_2$ to a noncrystalline form, the relative permittivity value of $ZrO_2$ obtained by doping Al of 25 to 28 is lower than a case where doping is not performed. Therefore, there is a problem in that a high relative permittivity cannot be obtained.

With the technique described in Non-Patent Document 4 in which Al and N are doped on $HfO_2$, the relative permittivity value of HfAlON of 10 to 25 is lower compared to $HfO_2$ in Non-Patent Document 3 and Patent Document 1. Therefore, there is a problem in that a high relative permittivity cannot be obtained.

The present invention has been made in consideration of the conventional problems described above, and an object thereof is to provide a dielectric film with a high relative permittivity, heat resistance with respect to an annealing treatment at 1000° C., and superior surface flatness, and a semiconductor device using the dielectric film.

An intense deliberation by the present inventors to resolve the problems described above has led to a discovery in that, with a dielectric film including a composite oxynitride containing an element A made of Hf, an element B made of Si, and N and O, by setting mole fractions B/(A+B+N) and N/(A+B+N) to specific ranges and by performing crystallization, superior flatness can be achieved in addition to a higher permittivity and heat resistance, which resulted in the present invention.

A first aspect of the present invention is a dielectric film comprising a composite oxynitride containing an element A being Hf, an element B being Al or Si, and N and O, wherein mole fraction of the element A, the element B, and N expressed as B/(A+B+N) ranges from 0.015 to 0.095 and mole fraction of the element A, the element B, and N expressed as N/(A+B+N) equals or exceeds 0.045, and the dielectric film has a crystalline structure.

In addition, a second aspect of the present invention is a non-volatile semiconductor device comprising: a substrate with at least a surface including a semiconductor layer; a gate electrode formed on the substrate; and a laminated gate insulating film sequentially laminated between the substrate and the gate electrode, wherein at least one layer among the insulating films that make up the laminated gate insulating film is the dielectric film according to claim 1.

Furthermore, a third aspect of the present invention is a non-volatile semiconductor device comprising: a substrate with at least a surface including a semiconductor layer; a gate electrode formed on the substrate; and a structure in which an insulating film, a floating electrode, and an insulating film are laminated in sequence between the substrate and the gate electrode, wherein at least a portion of the insulating films formed between the gate electrode and the floating electrode is the dielectric film according to the first aspect of the present invention.

Moreover, a fourth aspect of the present invention is a semiconductor device having, on a substrate with at least a surface including a semiconductor layer, a source region, a drain region, and a gate electrode formed via an insulating film, wherein the insulating film is a film including the dielectric film according to the first aspect of the present invention.

In addition, a fifth aspect of the present invention is a semiconductor device comprising a capacitor, the capacitor including: a first electrode; a second electrode; and a layer including a dielectric film sandwiched between the first electrode and the second electrode, wherein the dielectric film is the dielectric film according to the first aspect of the present invention.

Furthermore, a sixth aspect of the present invention is a capacitor comprising: a first electrode; a second electrode; and a layer including a dielectric film sandwiched between the first electrode and the second electrode, wherein the dielectric film is the dielectric film according to the first aspect of the present invention.

Moreover, a seventh aspect of the present invention is a method of manufacturing a dielectric film comprising a composite oxynitride containing an element A being Hf, an element B being Al or Si, and N and O, the method including: a step of forming a film including a composite oxynitride whose mole fraction of the element A, the element B, and N expressed as B/(A+B+N) ranges from 0.015 to 0.095 and mole fraction of the element A, the element B, and N expressed as N/(A+B+N) equals or exceeds 0.045; and a heat treatment step for crystallizing the film including the composite oxynitride to form a composite oxynitride having a crystalline structure with a cubical crystal incorporation percentage of 80% or higher and a value of a ratio [220]/[111] of a [220] peak intensity and a [111] peak intensity in an X-ray diffraction spectrum of 0.6 or greater.

In addition, an eighth aspect of the present invention is a computer-readable storage medium storing a program for causing a computer to execute a method of forming a high dielectric film included in an MIS capacitor, wherein the method of forming includes: a first step of depositing, by physical vapor deposition using metallic targets of Hf and Al or Si, a dielectric film including a composite oxynitride containing an element A being Hf, an element B being Al or Si, and N and O, and whose mole fraction of the element A, the element B, and N expressed as B/(A+B+N) ranges from 0.015 to 0.095 and mole fraction of the element A, the element B, and N expressed as N/(A+B+N) equals or exceeds 0.045, on a silicon substrate having a silicon dioxide film; a second step of depositing a film selected from among a TiN film, Ti, TaN, W, Pt, Ru, Al, and Si on the dielectric film by physical vapor deposition using a metallic target; and a third step, after the first step or the second step, of performing an annealing treatment and crystallizing the dielectric film.

Furthermore, a ninth aspect of the present invention is a computer-readable storage medium storing a program for causing a computer to execute a method of forming a high dielectric film included in a semiconductor device, wherein the method of forming includes: a first step of depositing, by CVD or ALD using a organic metallic material and an oxidant, a dielectric film including a composite oxynitride containing an element A being Hf, an element B being Al or Si, and N and O, and whose mole fraction of the element A, the element B, and N expressed as B/(A+B+N) ranges from 0.015 to 0.095 and mole fraction of the element A, the element B, and N expressed as N/(A+B+N) equals or exceeds 0.045, on a silicon substrate having a silicon dioxide film; and a second step, after the first step, of performing an annealing treatment and crystallizing the dielectric film.

Moreover, a tenth aspect of the present invention is a computer-readable storage medium storing a program for causing a computer to execute a method of forming a high dielectric film included in a semiconductor device, wherein the method of forming includes: a first step of forming an element isolation region on a silicon substrate by STI; a second step of forming a silicon dioxide film on the element-isolated silicon substrate by a thermal oxidation method; a third step of depositing, by physical vapor deposition using metallic targets of Hf and Al or Si, a dielectric film including a composite oxynitride containing an element A being Hf, an element B being Al or Si, and N and O, and whose mole fraction of the element A, the element B, and N expressed as B/(A+B+N) ranges from 0.015 to 0.095 and mole fraction of the element A, element B, and N expressed as N/(A+B+N) equals or exceeds 0.045, on the silicon dioxide film; a fourth step of forming a gate electrode film on the dielectric film; a fifth step of processing the gate electrode film using lithography and RIE; a sixth step of performing ion implantation and forming an extension region using the processed gate electrode film as a mask; a seventh step of depositing a silicon nitride film and a silicon dioxide film on the silicon substrate on which the extension region has been formed; an eighth step of forming a gate sidewall by etching back the deposited silicon nitride film and silicon dioxide film; and a ninth step of performing ion implantation and forming a source-drain region under the extension region.

In addition, an eleventh aspect of the present invention is a computer-readable storage medium storing a program for causing a computer to execute a method of forming a non-volatile memory element or a FG non-volatile semiconductor element including a high dielectric film, wherein the method of forming includes: a first step of forming an element isolation region on a silicon substrate by STI; a second step of forming a first insulating film on the element-isolated silicon substrate by a thermal oxidation method; a third step of forming a second insulating film on the first insulating film by LPCVD; a fourth step of forming a third insulating film on the second insulating film using any of MOCVD, ALD, and PVD; a fifth step of forming, on the third insulating film, by a CVD method or an ALD method using an organic metallic material and an oxidant, a dielectric film including a composite oxynitride containing an element A being Hf, an element B being Al or Si, and N and O, and whose mole fraction of the element A, the element B, and N expressed as B/(A+B+N) ranges from 0.015 to 0.095 and mole fraction of the element A, the element B, and N expressed as N/(A+B+N) equals or exceeds 0.045; a sixth step of forming a fifth insulating film on the fourth insulating film using any of MOCVD, ALD, and PVD; a seventh step of forming a gate electrode film on the fifth insulating film; an eighth step of processing the gate electrode film using a lithographic technique and an RIE technique; a ninth step of performing ion implantation and forming an extension region using the processed gate electrode film as a mask; a tenth step of depositing a silicon nitride film and a silicon dioxide film on the silicon substrate on which the extension region has been formed; an eleventh step of forming a gate sidewall by etching back the deposited silicon nitride film and silicon dioxide film; and a twelfth step of performing ion implantation and forming a source-drain region under the extension region.

Furthermore, a twelfth aspect of the present invention is a computer-readable storage medium storing a program for causing a computer to execute a method of forming a DRAM including a high dielectric film, wherein the method of forming includes: a first step of forming an element isolation region on a silicon substrate by LOCOS or STI; a second step of forming a gate insulating film and a gate electrode film processed into a desired shape using lithography and RIE in an active region enclosed by the element isolation region; a third step of performing ion implantation and forming a diffusion region to become a source region or a drain region using the gate insulating film and the gate electrode film as a mask; a fourth step of forming a first interlayer insulating film on the silicon substrate by CVD; a fifth step of selectively etching the first interlayer insulating film and forming a first contact hole using lithography; a sixth step of forming a capacitor contact and a bit contact in the first contact hole so as to be connected to the diffusion region; a seventh step of forming a stopper insulating film and a second interlayer insulating film on the first interlayer insulating film by CVD; an eighth step of etching the second interlayer insulating film and forming a cylinder groove so as to expose the capacitor contact using lithography; a ninth step of forming a first electrode film in the cylinder groove by CVD or ALD; a tenth step of forming, by a CVD method or an ALD method using an organic metallic material and an oxidant, a dielectric film including a composite oxynitride containing an element A being Hf, an element B being Al or Si, and N and O, and whose mole fraction of the element A, the element B, and N expressed as B/(A+B+N) ranges from 0.015 to 0.095 and mole fraction of the element A, the element B, and N expressed as N/(A+B+N) equals or exceeds 0.045, on the first electrode film; an eleventh step of performing an annealing treatment and crystallizing the dielectric film; a twelfth step of forming a second electrode film on the dielectric film by CVD or ALD, thereby forming an MIS-structure capacitor with the first electrode film, the dielectric film, and the second electrode film; a thirteenth step of forming a capacitor wiring on the MIS capacitor by CVD; a fourteenth step of forming an opening above the bit contact through which the second interlayer insulating film is to be exposed; a fifteenth step of forming a third interlayer insulating film on the capacitor wiring by CVD, and subsequently selectively etching the third interlayer insulating film and forming a second contact hole inside the opening by lithography; and a sixteenth step of forming a barrier metallic film and a bit wiring in the second contact hole by CVD.

According to the present invention, a dielectric film with a high relative permittivity and superior heat resistance and flatness can be obtained. Therefore, the relative permittivity of a dielectric film according to the present invention does not decrease even when performing a high-temperature annealing process at 1000° C. or more. Consequently, even when the high-temperature annealing process is applied to a gate insulating film of a CMOS transistor element, a blocking insulating film of a non-volatile semiconductor device, or a capacitor insulating film of a DRAM element having a high-temperature annealing treatment process, an equivalent oxide thickness (EOT) can be reduced by higher permittivity.

BRIEF DESCRIPTION OF THE DRAWINGS

FIG. 11 is a diagram illustrating relative permittivity values of the MIS capacitor illustrated in FIG. 1;

DESCRIPTION OF THE PREFERRED EMBODIMENTS

Hereinafter, embodiments of the present invention will be described in detail with reference to the drawings.

A dielectric film according to the present invention will now be described using an example of an MIS (metal insulator semiconductor) capacitor in which a HfAlON film using Al as an element B is formed as a dielectric film according to the present invention on a silicon substrate having a silicon dioxide film on a surface thereof.

Figure 1:
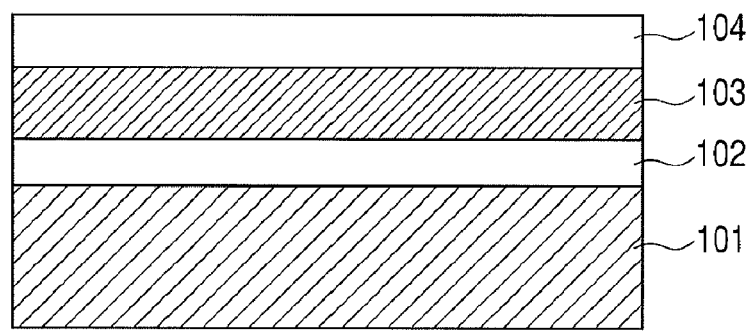
FIG. 1 is a cross-sectional diagram of an MIS capacitor using a dielectric film according to the present invention.

As illustrated in FIG. 1, a dielectric film 103 containing Hf, Al, N and O was deposited to a film thickness ranging from 5 nm to 25 nm on a silicon substrate 101 having, on a surface thereof, a silicon dioxide film 102 with a film thickness ranging from 3 nm to 5 nm by magnetron sputtering using a target made up of Hf and Al. In this case, a mole fraction between the Hf element and the Al element in the dielectric film 103 was adjusted by the mixing ratio of Hf and Al in the target. In addition, the ratio of the N element was adjusted by the flow rate of nitrogen gas introduced during sputtering. The mole fraction of the dielectric film was evaluated by an analysis using XPS (X-ray photoelectron spectroscopy).

In a similar manner, samples in which a HfON film not including Al and a HfAlO film not including N are deposited were also fabricated as the dielectric film 103.

Next, a TiN film 104 of a film thickness of 10 nm was deposited by a sputtering method on the dielectric film 103.

The dielectric film 103 was then crystallized by performing heat treatment (annealing) on the laminated film made up of the dielectric film 103 and the TiN film 104 in a nitrogen atmosphere at a range from 850° C. to 1000° C.

Next, the TiN film 104 was processed to a desired size using a lithographic technique and an RIE (reactive ion etching) technique to form an MIS capacitor structure. In this case, the silicon substrate 101 is assumed to be the lower electrode and the TiN film 104 the upper electrode.

Next, the electrical characteristics of the fabricated MIS capacitor were evaluated.

Figure 2:
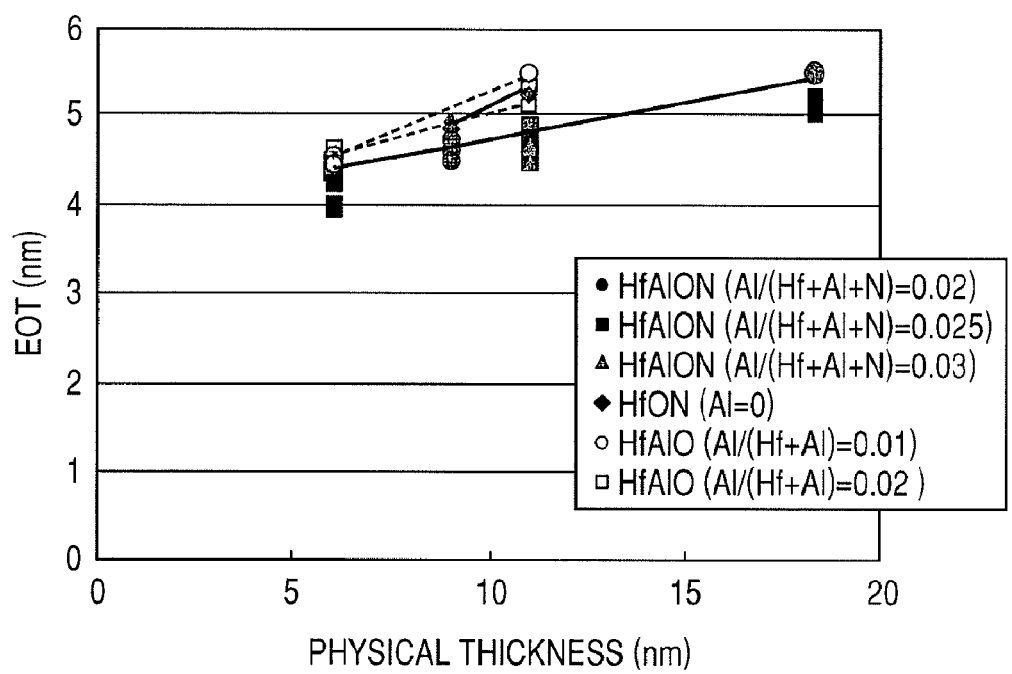
FIG. 2 is a diagram illustrating a relationship between EOT and physical film thickness of the MIS capacitor illustrated in FIG. 1.

FIG. 2 illustrates relationships between an equivalent oxide thickness (EOT) and a physical thickness of a sample in which a mole fraction Al/(Hf+Al+N) (B/(A+B+N)) of a HfAlON film was altered, a sample in which a mole fraction Al/(Hf+Al) of a HfAlO film was altered, and a sample in which a HFON film was formed. All samples have been crystallized by a 1000° C.-annealing treatment.

Equivalent oxide thickness (EOT) will now be described. Regardless of the insulating film type, assuming that the insulating film material is a silicon dioxide film, an electrical film thickness of an insulating film obtained by a back calculation from capacity is referred to as an equivalent oxide thickness. That is, if $\in h$ denotes a relative permittivity of an insulating film, ∈0 denotes a relative permittivity of a silicon dioxide film, and dh denotes a thickness of the insulating film, then an equivalent oxide thickness de may be expressed by the following equation (1).

$$de = dh \times (\in 0 / \in h) \quad (1)$$

The above equation (1) indicates that when a material having a permittivity ∈h greater than the relative permittivity ∈0 of a silicon dioxide film is used in an insulating film, equivalent oxide thickness de becomes equivalent to that of a silicon dioxide film thinner than the film thickness dh of the insulating film. The relative permittivity ∈0 of a silicon dioxide film is around 3.9. Therefore, for example, with a film made of a high permittivity material of ∈h=39, even if the physical thickness thereof dh is set to 15 nm, the equivalent oxide thickness (electrical film thickness) de takes a value of 1.5 nm. As such, leakage current can be significantly reduced while maintaining the capacitance of the insulating film at a level similar to a silicon dioxide film with a film thickness of 1.5 nm.

From FIG. 2, it is confirmed that the EOT of the HfAlON film with a physical thickness of 11 nm is 4.6 nm, and that thinning of EOT is achieved in comparison to the HfAlO film (EOT=5.5 nm) and the HfON film (EOT=5.3 nm) with the same physical thicknesses.

Figure 3:
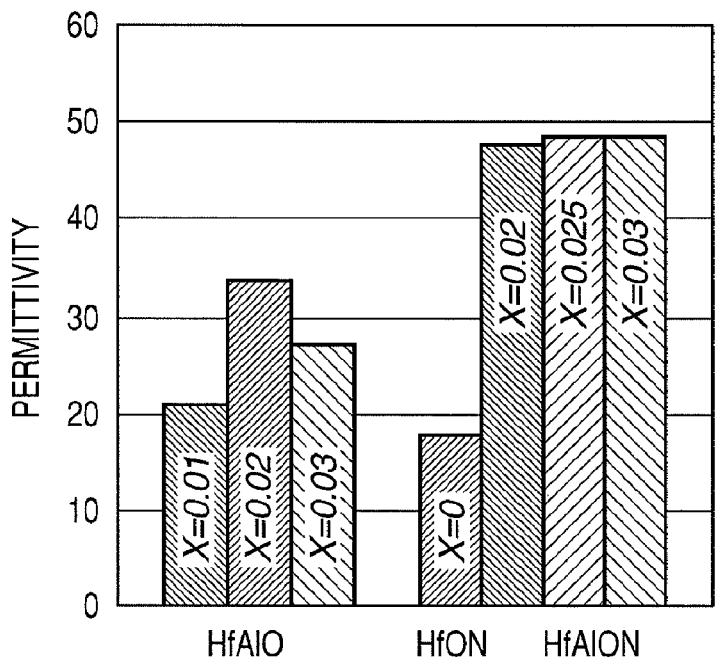
FIG. 3 is a diagram illustrating relative permittivity of the MIS capacitor illustrated in FIG. 1.

FIG. 3 illustrates values of relative permittivity derived from the EOT and physical thickness obtained in FIG. 2. Reference character X in FIG. 3 denotes a mole fraction Al/(Hf+Al+N) and a mole fraction Al/(Hf+Al). From FIG. 3, it is revealed that the HfAlON film has a relative permittivity of 48 which is significantly greater than the relative permittivity values of the HfAlO film and the HfON film which range from 15 to 35.

Figure 4:
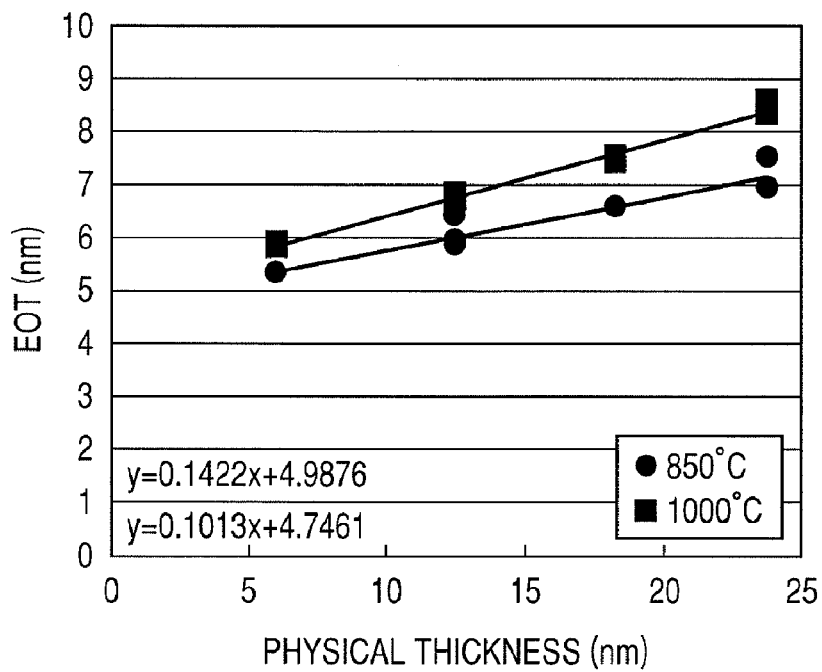
FIG. 4 is a diagram illustrating a relationship between EOT and physical film thickness of the MIS capacitor illustrated in FIG. 1.

Next, FIG. 4 illustrates annealing temperature dependences of EOT and physical thickness of a HfAlO film having a mole fraction Al(Hf+Al) of 0.03. From FIG. 4, it is confirmed that a HfAlO film subjected to a 1000° C.-annealing treatment manifests an increase in EOT due to a decrease in relative permittivity value in comparison to a HfAlO film subjected to an 850° C. annealing treatment. This result indicates that a HfAlO film not including N is not heat resistant with respect to a 1000° C.-annealing treatment, thereby revealing that the inclusion of N has improved 1000° C.-heat resistance.

Figure 5:
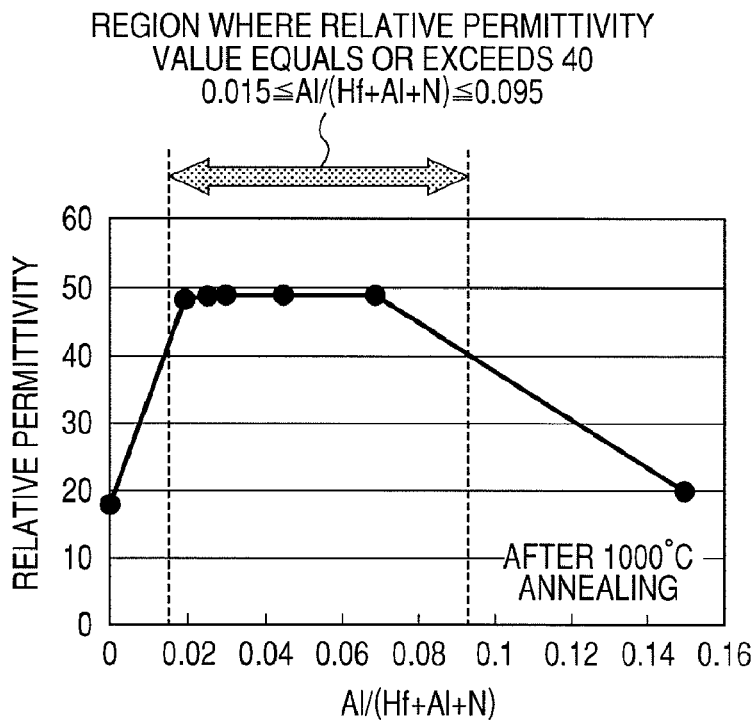
FIG. 5 is a diagram illustrating a relationship between relative permittivity and dielectric film composition of the MIS capacitor illustrated in FIG. 1.

FIG. 5 illustrates a relative permittivity of a sample (1000° C.-annealing treatment) that is a HfAlON film whose mole fraction Al/(Hf+Al+N) has been altered. From FIG. 5, it is confirmed that a relative permittivity value of 40 or higher is obtained when the mole fraction Al/(Hf+Al+N) ranges from 0.015 to 0.095. Therefore, it is necessary that the mole fraction of Al/(Hf+Al+N) ranges from 0.015 to 0.095 and preferably from 0.02 to 0.07 where a significant EOT thinning effect can be obtained.

Figure 6:
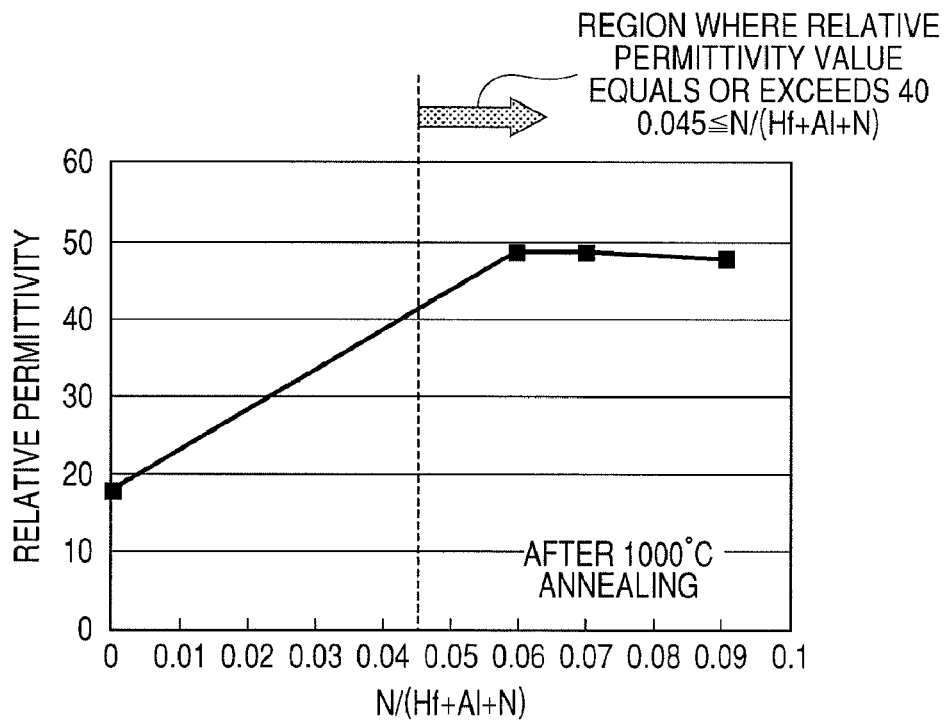
FIG. 6 is a diagram illustrating a relationship between relative permittivity and dielectric film composition of the MIS capacitor illustrated in FIG. 1.

FIG. 6 illustrates a relative permittivity of a sample (1000° C.-annealing treatment) that is HfAlON whose mole fraction N/(Hf+Al+N) (N/(A+B+N)) has been altered. From FIG. 6, it is confirmed that a relative permittivity value of 40 or higher is obtained when the mole fraction N/(Hf+Al+N) equals or exceeds 0.045. A mole fraction N/(Hf+Al+N) of less than 0.045 results in lower heat resistance as well as a reduction in relative permittivity due to 1000° C. annealing treatment. Therefore, a mole fraction N/(Hf+Al+N) equal to or exceeding 0.045 is necessary to obtained a dielectric film that also has heat resistance with respect to an annealing treatment at 1000° C. or higher.

Next, the crystalline structures of the respective dielectric films were evaluated by an X-ray diffraction spectrum (XRD) method.

Figure 7:
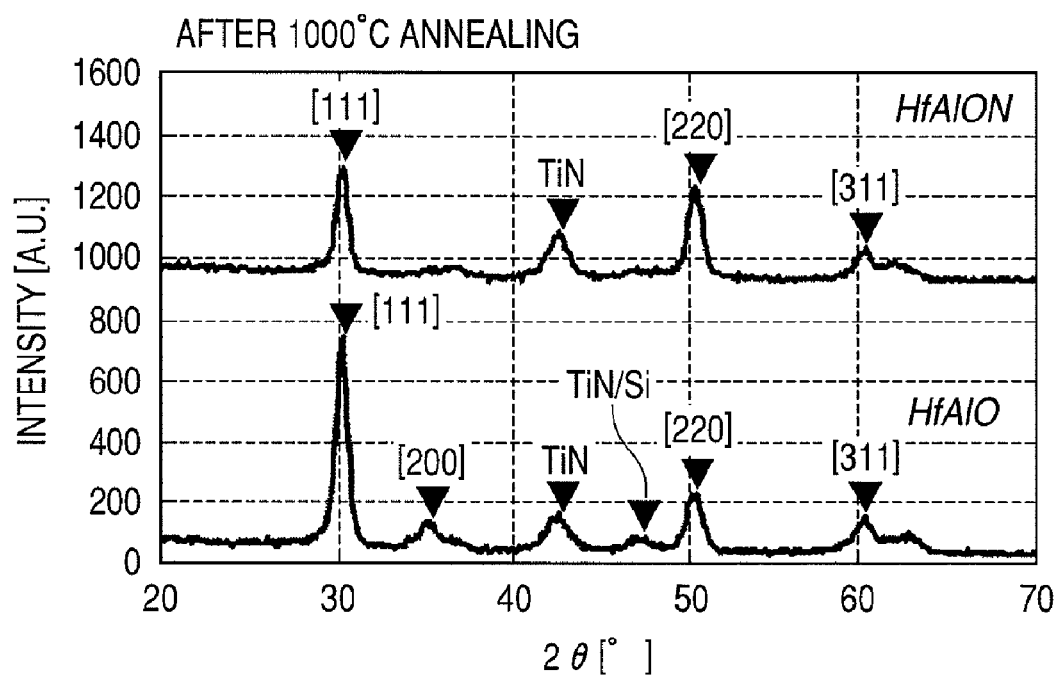
FIG. 7 is a diagram illustrating X-ray diffraction spectrums of dielectric films according to the present invention.

FIG. 7 illustrates X-ray diffraction spectrums of a HfAlO film whose mole fraction Al/(Hf+Al) is 0.03 and a HfAlON film whose mole fractions Al/(Hf+Al+N) is 0.03 and N/(Hf+Al+N) is 0.08 after annealing at 1000° C. From FIG. 7, it is confirmed that the HfAlO film and the HfAlON film have been crystallized by the 1000° C. annealing. In addition, peaks of [111], [220], and [311] representing crystal orientations of cubical crystals and tetragonal crystals can be observed near 2θ=30°, 50°, and 60° of the spectrums. Furthermore, an evaluation of incorporation percentages of cubical crystals and tetragonal crystals in the XRD spectrums revealed that the incorporation percentage of cubical crystals of 80% or higher is greater than the incorporation percentage of tetragonal crystals. Therefore, the effects of a dielectric film according to the present invention can be sufficiently exerted if the dielectric film contains 80% or more cubical crystals.

Figure 8:
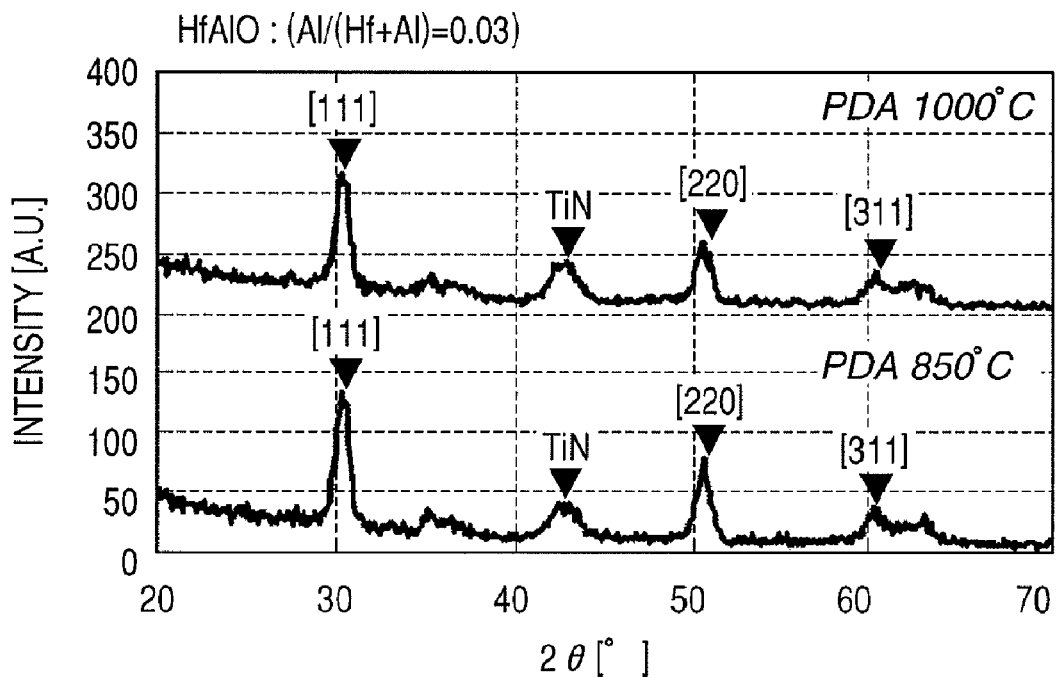
FIG. 8 is a diagram illustrating X-ray diffraction spectrums of a dielectric film made of HfAlO.

Moreover, a crystallization annealing temperature dependence of the X-ray diffraction spectrum of a HfAlO film is illustrated in FIG. 8. From FIG. 8, it is confirmed that both a HfAlO crystalline structure crystallized at 850° C. and a HfAlO crystalline structure crystallized at 1000° C. mainly includes cubical crystals.

From the results described above, it is shown that the effects of achieving higher permittivity and higher heat resistance with a HfAlON film containing Al and N are not attributable to a change in crystalline systems as described in the literature listed above.

Next, a comparison of [220]/[111] that is a ratio of a peak intensity of [220] to a peak intensity of [111] in the respective X-ray diffraction spectrums was performed.

Figure 9:
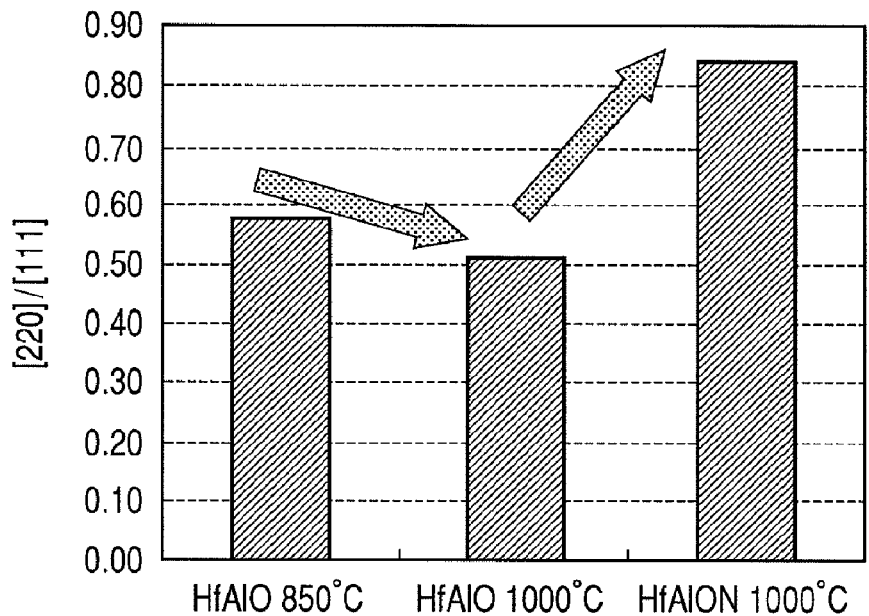
FIG. 9 is a diagram illustrating a relationship of peak intensity ratios of X-ray spectrums of dielectric films according to the present invention.

FIG. 9 illustrates peak intensity ratios [220]/[111] of HfAlO films crystallized by 850° C. and 1000° C. annealing and a HfAlON film crystallized by 1000° C. annealing. From FIG. 9, it is apparent that while the peak intensity ratio of the HfAlO film has decreased by the 1000° C. annealing treatment, the HfAlON film shows a high value of 0.8 or higher. Therefore, it is conceivable that the higher permittivity and higher heat resistance achieved by the HfAlON film is related to peak intensity.

Figure 10:
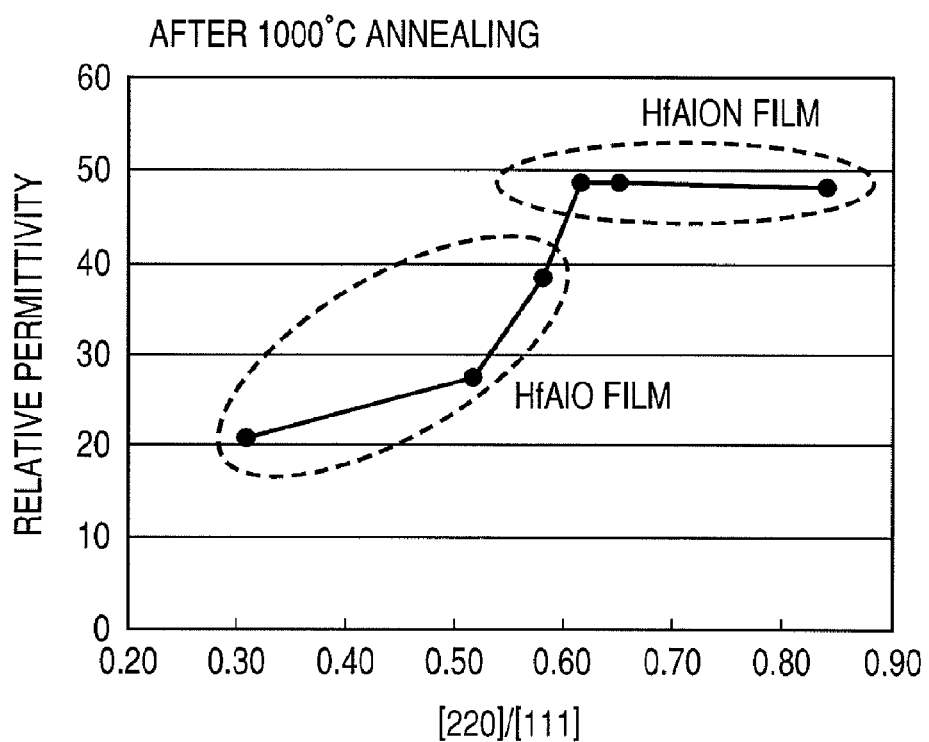
FIG. 10 is a diagram illustrating a relationship between peak intensity ratios and relative permittivity values of X-ray spectrums of dielectric films according to the present invention.

Furthermore, findings on a relationship between [220]/[111] ratios and relative permittivity are illustrated in FIG. 10. FIG. 10 illustrates the results of a comparison of relative permittivity values and [220]/[111] peak intensity ratios of X-ray diffraction spectrums with respect to samples of a HfAlO film and a HfAlON film crystallized by 1000° C. annealing whose mole fractions Al/(Hf+Al+N) have been altered. From FIG. 10, it is shown that relative permittivity increases as the [220]/[111] peak intensity ratio increases, and a high permittivity film with a relative permittivity value approaching 50 can be obtained in a [220]/[111] peak intensity ratio region of 0.6 or greater. Therefore, it is demonstrated that a dielectric film with a relative permittivity value of 40 or higher and which is heat resistant with respect to 1000° C. annealing favorably has a [220]/[111] peak intensity ratio of 0.6 or higher.

Next, the effect on relative permittivity of a TiN film deposited on a HfAlON film was evaluated. FIG. 11 illustrates a result of a comparison between a case of crystallization after laminating a TiN film and a case of crystallization without laminating a TiN film on a HfAlON film whose mole fraction Al/(Hf+Al+N) is 0.02 and whose mole fraction N/(Hf+Al+N) is 0.08. From FIG. 11, it is confirmed that both samples have high relative permittivity values approaching 50. Therefore, it is demonstrated that a high permittivity film with superior heat resistance can be obtained without depositing a TiN film during a HfAlON film crystallization process.

Figure 12B:
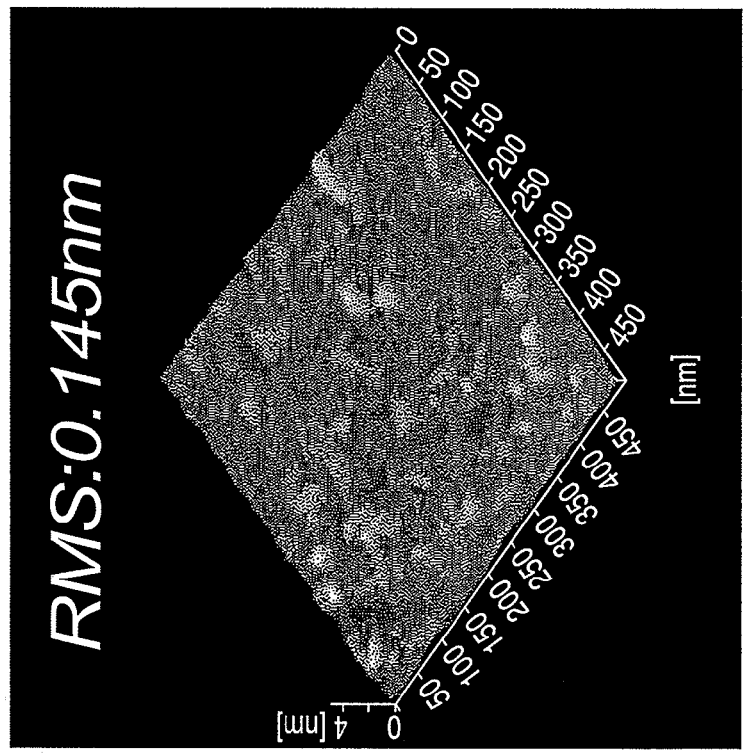
FIG. 12 is a diagram illustrating surface-observed images by AFM of dielectric films according to the present invention.
Figure 12A:
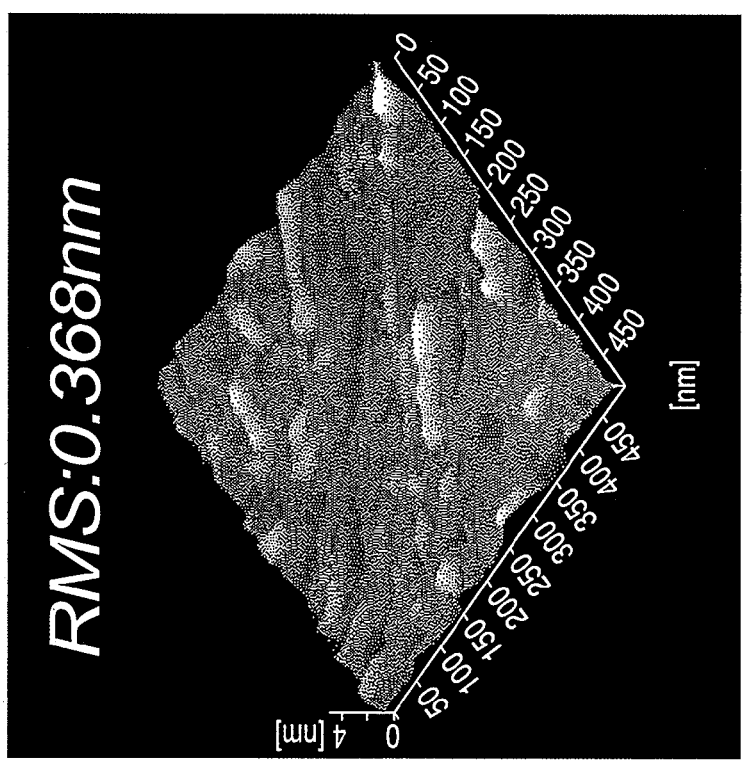
Figure 13:
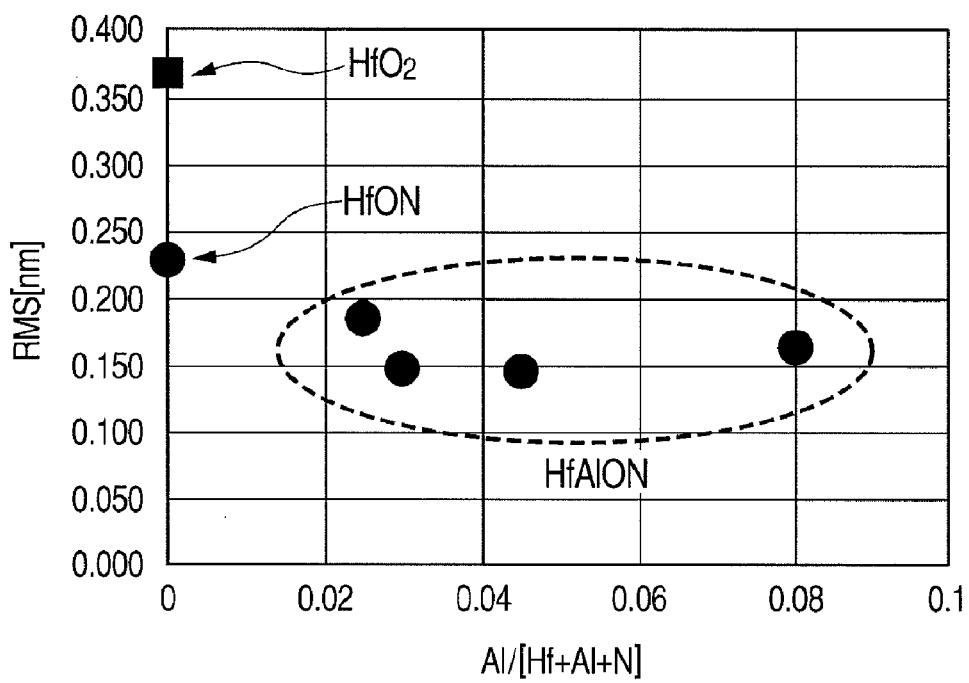
FIG. 13 is a diagram illustrating a relationship between a mole fractions Al/(Hf+Al+N) and surface roughness of dielectric films according to the present invention.

Next, the surface flatness of a HfAlON film was evaluated by an AFM (atomic force microscope). FIG. 12 illustrates AFM images of a HfO$_2$ film and a HfAlON film crystallized by an annealing treatment. RMS (root-mean-square) in the diagram denotes a root-mean-square roughness of a dielectric film surface. From the diagram, it is confirmed that the HfAlON film has a smaller RMS value compared to the HfO$_2$ film and therefore has superior flatness. In addition, FIG. 13 illustrates relationships between root-mean-square roughness (RMS) values and mole fractions Al/(Hf+Al+N) of surfaces of a HfO$_2$ film, a HfON film, and a HfAlON film whose mole fraction Al/(Hf+Al+N) has been altered. From the diagram, it is evident that surface roughness decreases by including N in the HfO$_2$ film, and further decreases by including N and Al. In particular, it is confirmed that surface roughness decreases in a mole fraction Al/(Hf+Al+N) range of 0.025 to 0.08. Therefore, it is demonstrated that a HfAlON film according to the present invention is a dielectric film with superior surface flatness.

From the above, since a dielectric film according to the present invention is a HfAlON film containing predetermined amounts of Al and N and has a crystalline structure, heat resistance can be secured while attaining high permittivity, and flatness can be improved. In addition, it is demonstrated that exceptional effects can be achieved when preferably having a crystalline structure with a cubical crystal incorporation percentage of 80% or higher and preferably having a [220]/[111] peak intensity ratio equal to or greater than a predetermined value. Furthermore, the effects are conceivably attributable to a novel phenomenon that differs from high permittivity technology that utilizes a change in crystalline systems due to elemental addition or a change phenomenon of crystalline systems due to the crystallization of a laminated structure of a dielectric film and a TiN film as described in the literature presented above.

Heretofore, a composite oxynitride having Hf as an element A and Al as an element B has been described as a dielectric film. However, it is confirmed that even with a HfSiO film with Si as an element B, by performing crystallization at a mole fraction Si/(Hf+Si+N) ranging from 0.015 to 0.095 and a mole fraction N/(Hf+Si+N) of 0.045 or higher, a crystalline structure having a cubical crystal incorporation percentage of 80% or higher and a value of [220]/[111] that is a ratio of a [220] peak intensity to a [111] peak intensity in an X-ray diffraction spectrum of 0.6 of higher can be obtained, and a relative permittivity value of 40 or more is obtained.

In addition, while results of crystallization annealing at 850° C. to 1000° C. has been described, similar effects can be obtained with crystallization annealing at 700° C. or higher and 1200° C. or lower, and particularly at 1200° C.

Furthermore, while a sputtering method using a target containing Hf and Al or Si has been described with respect to a process of forming a film made of a composite oxynitride, the choice of the sputtering method is not restrictive and, as will be described later, a dielectric film having similar effects can also be formed by a cosputtering method using a Hf target and an Al or Si target, an ALD method, or a CVD method.

Moreover, while a dielectric film formed on a silicon dioxide film has been described, this arrangement is not restrictive and, as will be described later, a sufficient effect can be achieved as long as the dielectric film according to the present invention is partially included in a gate insulating film, a blocking insulating film, or a DRAM capacitor insulating film.

In other words, a dielectric film according to the present invention is applicable to semiconductor device having a dielectric film as an insulating film. Specific semiconductor devices include, but are not restricted to, those described below.

A semiconductor device according to an embodiment of the present invention is a non-volatile semiconductor device including: a substrate with at least a surface including a semiconductor layer; a gate electrode formed on the substrate; and a laminated gate insulating film sequentially laminated between the substrate and the gate electrode, wherein at least one layer among the insulating films that make up the laminated gate insulating film is a dielectric film according to the present invention.

In addition, a semiconductor device according to another embodiment of the present invention is a non-volatile semiconductor device having a structure including: a substrate with at least a surface including a semiconductor layer; a gate electrode formed on the substrate; and an insulating film, a floating electrode, and an insulating film laminated in sequence between the substrate and the gate electrode, wherein at least a portion of the insulating films formed between the gate electrode and the floating electrode is a dielectric film according to the present invention.

Furthermore, a semiconductor device according to yet another embodiment of the present invention is a semiconductor device having, on a substrate with at least a surface including a semiconductor layer, a source region, a drain region, and a gate electrode formed via an insulating film, wherein the insulating film is a film including a dielectric film according to the present invention.

Moreover, a semiconductor device according to still another embodiment of the present invention is a semiconductor device having a capacitor, wherein the capacitor includes a first electrode, a second electrode, and a layer including a dielectric film sandwiched between the first electrode and the second electrode, and the dielectric film is a dielectric film according to the present invention. With a semiconductor device according to such an embodiment, the capacitor and a switching element having at least a surface thereof formed on a semiconductor layer may preferably be electrically connected. Alternatively, a face where the first electrode opposes the second electrode and a face where the second electrode opposes the first electrode may respectively be made up of a plurality of faces.

In addition, a dielectric film according to the present embodiment is also applicable to a capacitor including a first electrode, a second electrode, and a layer including a dielectric film sandwiched between the first electrode and the second electrode. In other words, a dielectric film according to the present invention is applicable to the dielectric film positioned between the first electrode and the second electrode.

The essence of the present invention is in the use of a dielectric film made of a composite oxynitride containing an element A made of Hf (hafnium), an element B made of Al (aluminum) or Si (silicon), N (nitrogen), and O (oxygen) and whose mole fractions of element A, element B and N are within the specific range described above, and not in the configurations themselves of applications to which the dielectric film is applied. Therefore, a dielectric film according to the present invention can be applied to any apparatus such as those exemplified above as long as the apparatus uses a dielectric film.

EXAMPLES

First Example

Example using Cosputtering

A first example of the present invention will now be described in detail with reference to the drawings.

FIG. 1 is a diagram illustrating an MIS capacitor having the dielectric film 103. A HfAlON film was deposited by a sputtering method as the dielectric film 103 on the silicon substrate 101 having the silicon dioxide film 102 with a film thickness of 3 to 5 nm on a surface thereof. Metallic targets of Hf and Al were used as targets. Argon, oxygen, and nitrogen were used as sputter gases. In other words, a substrate processing apparatus according to the present example includes, in a first chamber thereof, a supplying mechanism that supplies a Hf target, an Al target, and a sputter gas into the first chamber. More specifically, the substrate processing apparatus according to the present example includes a first physical vapor deposition mechanism for performing physical vapor deposition such as sputtering using a Hf target and an Al target.

A substrate temperature can be arbitrarily set within a range of 27° C. to 600° C., a target power to within a range of 50 W to 1000 W, a sputter gas pressure to within a range of 0.02 Pa to 0.1 Pa, an Ar gas flow rate to within a range of 1 sccm to 200 sccm, an oxygen gas flow rate to within a range of 1 sccm to 100 sccm, and a nitrogen gas flow rate to within a range of 1 sccm to 50 sccm.

In the example, the first physical vapor deposition mechanism was controlled so as to perform film formation at a substrate temperature of 30° C., a Hf target power of 600 W, an Al target power of 50 W to 500 W, a sputter gas pressure of 0.03 Pa, an Ar gas flow rate of 25 sccm, an oxygen gas flow rate of 9 sccm, and a nitrogen gas flow rate of 0 sccm to 20 sccm.

Figure 14:
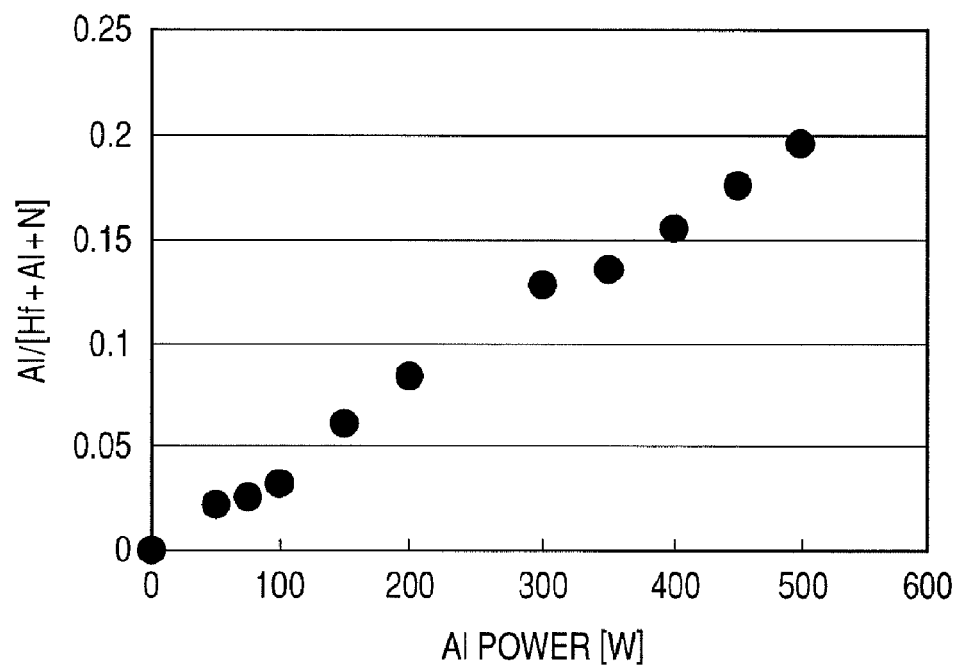
FIG. 14 is a diagram illustrating Al target power dependence of a mole fraction Al/(Hf+Al+N) of a dielectric film according to a first example.

In this case, a mole fraction Al/(Hf+Al+N) and a mole fraction N/(Hf+Al+N) of the dielectric film 103 according to the present invention can be controlled by the Hf target power, the Al target power, and the N flow rate. FIG. 14 is a diagram illustrating Al target power dependence of the mole fraction Al/(Hf+Al+N) of the dielectric film 103 formed in the present example. Composition was evaluated by an analysis using XPS (X-ray photoelectron spectroscopy). It was confirmed that by adjusting target powers in this manner, the mole fraction Al/(Hf+Al+N) can be controlled within a range of 0 to 0.2. In addition, a similar analysis of the mole fraction N/(Hf+Al+N) revealed that by adjusting the N flow rate, the mole fraction N/(Hf+Al+N) can be controlled within a range of 0 to 0.2.

As the dielectric film 103, a HfAlON film with Al mole fractions with a range of $0 \leq Al/(Hf+Al+N) \leq 0.20$ and N mole fractions with a range of $0 \leq N/(Hf+Al+N) \leq 0.20$, a HfAlO film, and a HfON film were formed by the formation process described above to a film thickness of 5 nm to 25 nm.

Next, a TiN film 104 with a film thickness of 10 nm was deposited by a sputtering method on the dielectric film 103. A metallic target of Ti was used as a target. Argon and nitrogen were used as sputter gases. For example, the substrate processing apparatus according to the present example includes a second chamber separate from the first chamber, and also includes, in the second chamber, a supplying mechanism that supplies a Ti target and a sputter gas into the second chamber. The substrate processing apparatus according to the present example includes a second physical vapor deposition mechanism for performing physical vapor deposition such as sputtering using a Ti target.

A substrate temperature can be arbitrarily set within a range of 27° C. to 600° C., a target power to within a range of 50 W to 1000 W, a sputter gas pressure to within a range of 0.02 Pa to 0.1 Pa, an Ar gas flow rate to within a range of 1 sccm to 200 sccm, and a nitrogen gas flow rate to within a range of 1 sccm to 50 sccm.

In the example, the second physical vapor deposition mechanism was controlled so as to perform film formation at a substrate temperature of 30° C., a Ti target power of 750 W, a sputter gas pressure of 0.03 Pa, an Ar gas flow rate of 30 sccm, and a nitrogen gas flow rate of 10 sccm.

Moreover, while the TiN film 104 was deposited on the dielectric film 103 in this example, Ti, TaN, W, Pt, Ru, Al, and Si can also be used as appropriate. Alternatively, a film selected from among a group made up of these elements may be deposited.

Next, an annealing treatment was performed in a nitrogen atmosphere at 1000° C. for 10 seconds to crystallize the dielectric film 103. In other words, the substrate processing apparatus according to the present example includes an annealing treatment mechanism for applying an annealing treatment to a substrate. In addition, the substrate processing apparatus according to the present example can include a separate chamber for annealing treatment.

In this case, while annealing treatment has been performed after depositing the TiN film 104, annealing treatment may alternatively be performed before depositing the TiN film 104. In addition, in this case, although annealing treatment has been performed in a nitrogen atmosphere, an oxygen atmosphere or an inert gas atmosphere such as Ar can be used as appropriate. Alternatively, annealing may be performed in an atmosphere selected from among a group made up of these gases.

Next, the TiN film 104 was processed to a desired size using a lithographic technique and an RIE technique to form an MIS capacitor structure.

A relative permittivity of the dielectric film 103 fabricated as described above was evaluated. Results thereof are illustrated in FIG. 5 and FIG. 6. From FIG. 5 and FIG. 6, it is revealed that a relative permittivity value of 40 or greater is attained when the mole fraction Al/(Hf+Al+N) ranges from 0.015 to 0.095, inclusive, and the mole fraction N/(Hf+Al+N) is equal to or greater than 0.045.

FIG. 7 illustrates a result of an evaluation by X-ray diffraction of crystalline phases of a HfAlO film whose mole fraction Al/(Hf+Al) is 0.03 and a HfAlON film whose mole fractions Al/(Hf+Al+N) is 0.03 and N/(Hf+Al+N) is 0.08 after a 1000° C.-annealing treatment. As is apparent from FIG. 7, both crystalline phases are mainly constituted by cubical crystals. Therefore, it is confirmed that the improvement in relative permittivity of a HfAlON film containing Al and N is not attributable to changes in crystalline phases.

FIG. 10 illustrates the results of a comparison of relative permittivity values and [220]/[111] peak intensity ratios of X-ray diffraction spectrums with respect to samples of a HfAlO film and a HfAlON film crystallized by 1000° C. annealing whose mole fractions Al/(Hf+Al+N) have been altered. From FIG. 10, it is shown that relative permittivity increases as the [220]/[111] peak intensity ratio increases, and a high permittivity film with a relative permittivity value approaching 50 can be obtained in a [220]/[111] peak intensity ratio region of 0.6 or greater.

FIG. 13 illustrates relationships between root-mean-square roughness (RMS) values and mole fractions Al/(Hf+Al+N) of surfaces of a HfO$_2$ film, a HfON film, and a HfAlON film whose mole fraction Al/(Hf+Al+N) has been altered. From FIG. 13, it is evident that surface roughness decreases by including N in the HfO$_2$ film, and by including N and Al, surface roughness further decreases while the flatness of the film surface is improved.

As shown above, according to the present example, with a dielectric film made of a composite oxynitride containing Hf, Al, N and O and having mole fractions of Hf, Al and N of Al/(Hf+Al+N) ranging from 0.015 to 0.095 and of N/(Hf+Al+N) equal to or greater than 0.045, a crystalline structure, preferably a crystalline structure having a cubical crystal incorporation percentage of 80% or higher, and preferably a [220]/[111] peak intensity ratio in an X-ray diffraction spectrum of 0.6 of higher, a high dielectric film with a relative permittivity value of 40 or higher and which is capable of withstanding a 1000° C.-annealing treatment can be obtained. In addition, it is revealed that superior surface flatness can be obtained in comparison to a dielectric film not containing Al and N.

Furthermore, while HfAlON arranged so that Hf contains Al is used as the dielectric film 103 in the present example, it is confirmed that a similar effect can be obtained with a HfSiON film in which Si is contained in place of Al at a similar composition range.

Moreover, it is confirmed that a similar effect can also be achieved with a structure in which the TiN film 104 is not deposited on the dielectric film 103.

Furthermore, it is confirmed that a similar effect can also be achieved by depositing a material selected from among a group made up of Ti, TaN, W, Pt, Ru, Al and Si instead of the TiN film 104.

Second Example

Example using ALD Method and CVD Method

The present example differs from the first example in that the dielectric film 103 is formed by a CVD method or an ALD method. Other formation processes are the same as the first example. Therefore, a substrate processing apparatus according to the present example includes a mechanism for realizing at least one of a CVD method and an ALD method such as a supplying mechanism that supplies an organic metallic material and an oxidant into a chamber.

A HfAlON film was formed as the dielectric film 103 by a CVD method or an ALD method at a range of 5 nm to 25 nm on the substrate 101 having the silicon dioxide film 102 on a surface thereof. A substrate temperature was set to 300° C., trimethylaluminum (Al(CH$_3$)$_3$) and tetrakis(diethylamino) hafnium (Hf[(C$_2$H$_5$)$_2$N]$_4$) were used as organic metallic materials, and H$_2$O was used as an oxidant. The method of forming a dielectric film can be set by controlling a partial pressure of the oxidant to be introduced, whereby the CVD method is adopted when the partial pressure of the oxidant is high and the ALD method is adopted when the partial pressure of the oxidant is low. In addition, the dielectric film can be formed by the CVD method when an organic metallic material gas and an oxidant are supplied simultaneously.

Figure 15:
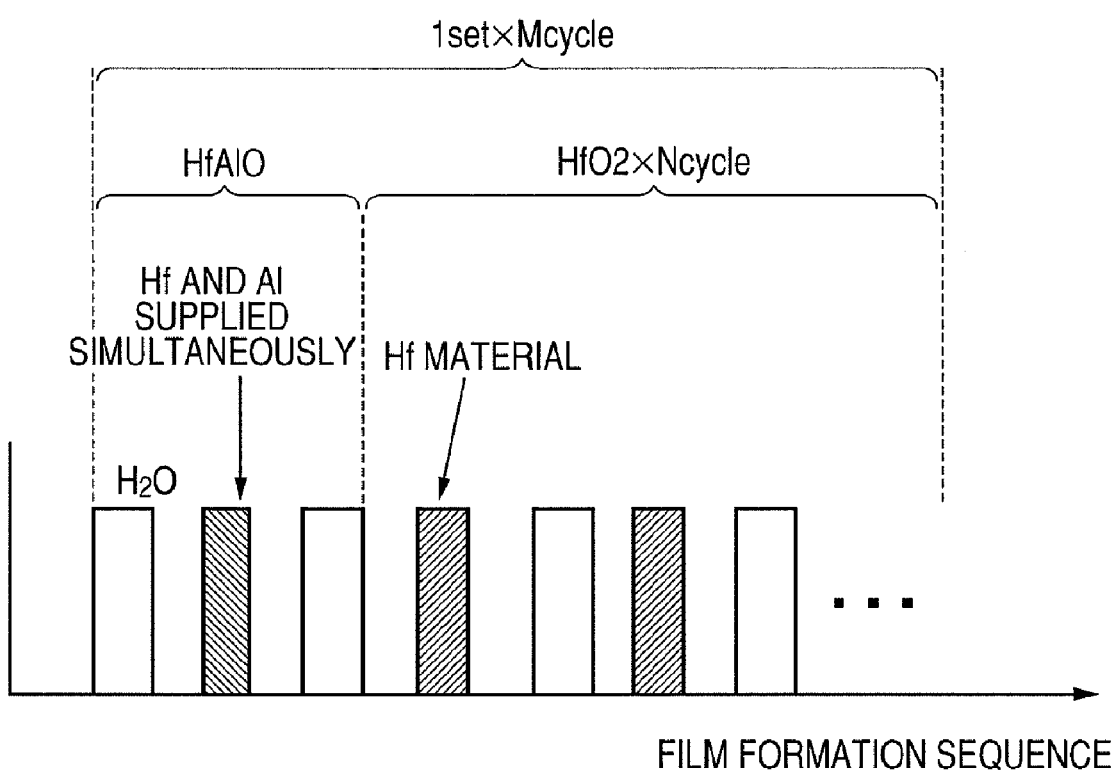
FIG. 15 is a diagram illustrating a base gas supplying process according to a second example.

FIG. 15 illustrates an outline of a raw gas supplying process according to the present example. As illustrated in FIG. 15, the raw gas supplying process includes a forming process of a metal-oxide layer including Hf and Al (HfAlO film) and a HfO$_2$ forming process.

In the HfAlO film forming process, H$_2$O, which is an oxidant, is supplied onto the substrate. A mass flow controller supplies H$_2$O at a flow rate of 10 sccm for 2 seconds. Next, an Al material (Al(CH$_3$)$_3$) and a Hf material (Hf[(C$_2$H$_5$)$_2$N]$_4$) are supplied simultaneously. A mass flow controller controls and supplies the Al material at a flow rate of 0.5 sccm. In addition, the Hf material is supplied from a container heated to 80° C. by bubbling of nitrogen gas at a flow rate of 20 sccm. In this case, raw gas is supplied for 20 seconds.

In the HfO$_2$ forming process, a Hf material (Hf[(C$_2$H$_5$)$_2$N]$_4$) and an oxidant H$_2$O are alternately supplied. At this point, a mass flow controller supplies H$_2$O at a flow rate of 5 sccm for 2 seconds. In addition, the Hf material is supplied from an 80° C.-container by bubbling of nitrogen gas at a flow rate of 20 sccm. In this case, raw gas is supplied for 20 seconds.

In this case, an Al composition of the metal-oxide layer according to the present invention can be controlled by a ratio (film thickness ratio) between the numbers of film formation cycles of HfAlO and HfO$_2$ described above. That is, by repeating, for M cycles, a set involving first performing one cycle of HfAlO and then performing N cycles of HfO$_2$, Hf$_{(1-x)}$Al$_x$O$_y$ having a desired composition and film thickness can be formed. In addition, it is confirmed that the Al composition can be controlled even using a method in which a Hf material is not introduced in the HfAlO film forming process.

In the forming process described above, a HfAlO film is formed within an Al mole fraction range of 0<Al/(Hf+Al)≦0.10 and a film thickness range of 5 nm to 25 nm. Next, a nitriding treatment is performed in an NH$_3$ atmosphere at a temperature of 700° C. to 850° C. for 10 minutes to form a HfAlON film. That is, the substrate processing apparatus according to the present example includes a mechanism for performing the nitriding treatment described above. The substrate processing apparatus according to the present example can separately include a chamber for performing a nitriding treatment. While a nitriding treatment is performed in an NH$_3$ atmosphere in this example, a nitriding treatment may alternatively be performed by a nitrogen radical process.

Next, an annealing treatment was performed in a nitrogen atmosphere at 1000° C. for 10 seconds to crystallize the HfAlON film. In addition, in this case, although annealing treatment is performed in a nitrogen atmosphere, gases such as oxygen or inert gases such as Ar can be used as appropriate. Alternatively, annealing may be performed in an atmosphere selected from among a group made up of these gases.

An evaluation of the relative permittivity of the dielectric film fabricated as described above and whose Al mole fraction is within a range of 0≦Al/(Hf+Al+N)≦0.10 and whose N mole fraction is within a range of 0≦N/(Hf+Al+N)≦0.20 revealed that a relative permittivity value of 40 or greater is attained when the mole fraction Al/(Hf+Al+N) ranges from 0.015 to 0.095, inclusive, and the mole fraction N/(Hf+Al+N) is equal to or greater than 0.045.

In addition, an evaluation by X-ray diffraction of crystalline phases of a HfAlO film whose mole fraction Al/(Hf+Al) is 0.03 and a HfAlON film whose mole fractions Al/(Hf+Al+N) is 0.03 and N/(Hf+Al+N) is 0.08 revealed that the HfAlON film has crystallized and has a crystalline phase primarily made up of cubical crystals and similar to the HfAlO film.

Furthermore, a comparison of relative permittivity values and [220]/[111] peak intensity ratios of X-ray diffraction spectrums of samples obtained by altering the mole fractions Al/(Hf+Al+N) of a HfAlO film and a HfAlON film revealed that relative permittivity increases as the [220]/[111] peak intensity ratio increases, and a high permittivity film with a relative permittivity value approaching 50 can be obtained in a [220]/[111] peak intensity ratio region of 0.6 or greater.

Moreover, an AFM evaluation of the surface flatness of the HfAlON film revealed that superior flatness is achieved in comparison with the HfO$_2$ film and the HfON film not containing Al and N.

From the present example, it is confirmed that a method of forming a dielectric film according to the present invention achieves the same effects as the first example even when using a CVD method or an ALD method.

Third Example

Example Applied to Gate Insulating Film

A third example of the present invention will now be described in detail with reference to the drawings.

Figure 16:
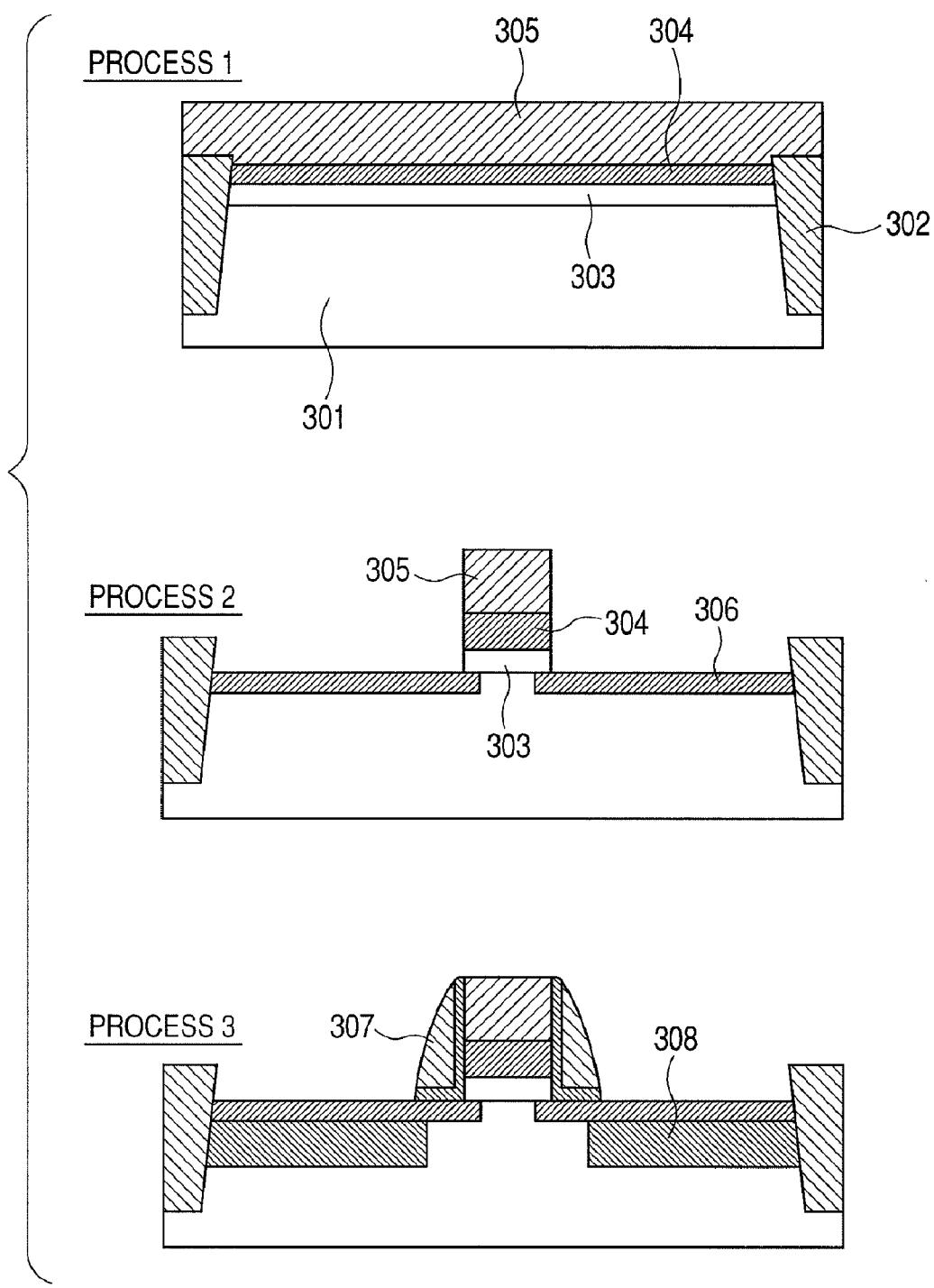
FIG. 16 is a diagram illustrating processes of a semiconductor device manufacturing method according to a third example.

FIG. 16 is a diagram illustrating processes of a semiconductor device manufacturing method according to a third example of the present invention.

First, as depicted by process 1 in FIG. 16, a substrate processing apparatus according to the present example forms an element isolation region 302 on a surface of a silicon substrate 301 using a STI (shallow trench isolation) technique. The substrate processing apparatus according to the present example then forms a silicon dioxide film 303 with a film thickness of 1.8 nm on the element-isolated surface of the silicon substrate using a thermal oxidation method. Subsequently, the substrate processing apparatus according to the present example forms a HfAlON film with a film thickness ranging from 1 nm to 10 nm as a dielectric film 304 using the same method as the first example or the second example. An annealing treatment is then performed in a nitrogen atmosphere at 1000° C. for 10 seconds to crystallize the dielectric film 304.

Subsequently, the substrate processing apparatus according to the present example first forms a poly-Si 305 with a thickness of 150 nm on the dielectric film 304, processes a gate electrode using a lithographic technique and an RIE technique as depicted by process 2 in FIG. 16, and then performs ion implantation to self-aligningly form an extension region 306 using the gate electrode as a mask.

Furthermore, as depicted by process 3 in FIG. 16, the substrate processing apparatus according to the present example sequentially deposits a silicon nitride film and a silicon dioxide film, and subsequently performs etch-back to form a gate sidewall 307. The substrate processing apparatus according to the present example once again performs ion implantation in this state, and forms a source-drain region 308 through active annealing. Moreover, the crystallization of the HfAlON film may be performed by an active annealing process. In this case, an crystallization annealing process following deposition of the HfAlON film can be omitted.

An evaluation of the electrical characteristics of the fabricated element revealed that with a HfAlON film whose Al mole fraction is within a range of 0.015≦Al/(Hf+Al+N)≦0.095 and whose N mole fraction is within a range of N/(Hf+Al+N) a 0.045, relative permittivity increases in comparison with HfO$_2$ whose Al/(Hf+Al+N)=0 and N/(Hf+Al+N)=0, and as a result, leakage current can be reduced in comparison with HfO$_2$.

In addition, an evaluation by X-ray diffraction of crystalline phases of a HfAlO film whose mole fraction Al/(Hf+Al) is 0.03 and a HfAlON film whose mole fractions Al/(Hf+Al+N) is 0.03 and N/(Hf+Al+N) is 0.08 revealed that the HfAlON film has crystallized and has a crystalline phase primarily made up of cubical crystals and similar to the HfAlO film.

Furthermore, a comparison of relative permittivity values and [220]/[111] peak intensity ratios of X-ray diffraction spectrums of samples obtained by altering the mole fractions Al/(Hf+Al+N) of a HfAlO film and a HfAlON film revealed that relative permittivity increases as the [220]/[111] peak intensity ratio increases, and a high permittivity film with a relative permittivity value of approximately 50 can be obtained in a [220]/[111] peak intensity ratio region of 0.6 or greater.

As shown above, with a semiconductor device according to the present example, by using a HfAlON having mole fractions of Hf, Al and N of Al/(Hf+Al+N) ranging from 0.015 to 0.095 and of N/(Hf+Al+N) equal to or greater than 0.045, a crystalline structure, preferably a crystalline structure with a tetragonal crystalline phase, and preferably a [220]/[111] peak intensity ratio in an X-ray diffraction spectrum of 0.6 of higher in a portion of a gate electrode film of a MOSFET, gate leakage current can be reduced.

Fourth Example

Example Applied to Blocking Film of Non-volatile Memory Element

Figure 17:
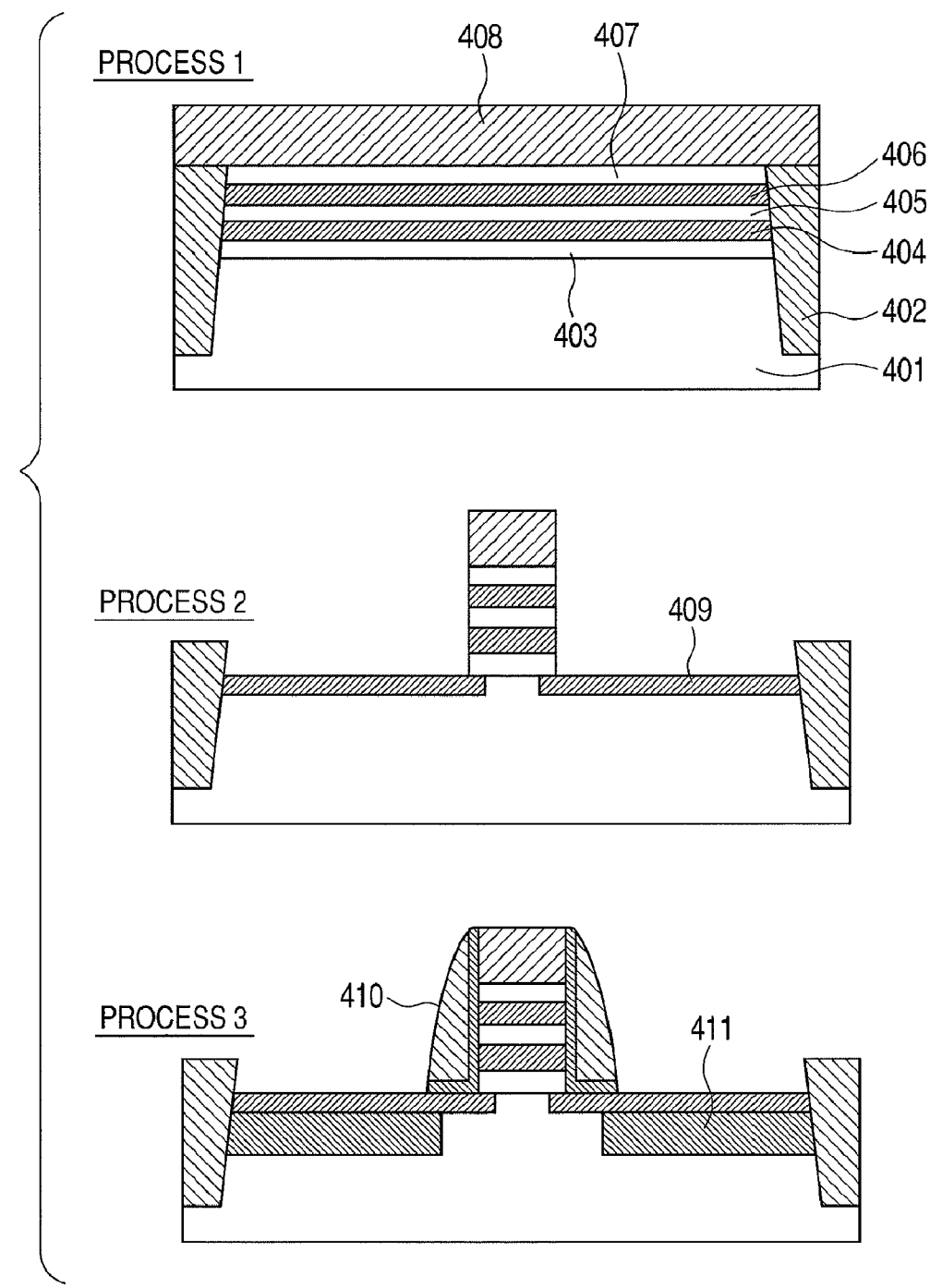
FIG. 17 is a diagram illustrating processes of a semiconductor device manufacturing method according to a fourth example.

FIG. 17 is a cross-sectional diagram illustrating fabricating processes of a semiconductor element according to a fourth example of the present invention.

First, as depicted by process 1 in FIG. 17, a substrate processing apparatus according to the present example forms an element isolation region 402 on a surface of a silicon substrate 401 using a STI (shallow trench isolation) technique.

The substrate processing apparatus according to the present example then forms a silicon dioxide film as a first insulating film 403 to 30 Å to 100 Å on the element-isolated surface of the silicon substrate 401 using a thermal oxidation method. Subsequently, the substrate processing apparatus according to the present example forms a silicon nitride film as a second insulating film 404 to 30 Å to 100 Å using an LPCVD (low pressure chemical vapor deposition) method. Next, the substrate processing apparatus according to the present example forms an aluminum oxide film as a third insulating film 405 to 5 Å to 50 Å. As a method of forming the aluminum oxide layer, an MOCVD method, an ALD (atomic layer deposition) method, or a PVD (physical vapor deposition) method may be used. Subsequently, the substrate processing apparatus according to the present example forms a HfAlON film with a film thickness ranging from 5 nm to 20 nm as a fourth insulating film 406 using the same method as the first example or the second example. Next, the substrate processing apparatus according to the present example forms an aluminum oxide film as a fifth insulating film 407 to 5 Å to 50 Å. An MOCVD method, an ALD method, or a PVD method may be used as a method of forming the fifth insulating film 407.

Subsequently, the substrate processing apparatus according to the present example first forms a poly-Si film with a thickness of 150 nm as a gate electrode 408, processes a gate electrode using a lithographic technique and an RIE (reactive ion etching) technique as depicted by process 2 in FIG. 17, and then performs ion implantation to self-aligningly form an extension region 409 using the gate electrode as a mask. Furthermore, as depicted by process 3 in FIG. 17, the substrate processing apparatus according to the present example sequentially deposits a silicon nitride film and a silicon dioxide film, and subsequently performs etch-back to form a gate sidewall 410. The substrate processing apparatus according to the present example once again performs ion implantation in this state, and forms a source-drain region 411 through active annealing.

An evaluation of the electrical characteristics of the fabricated semiconductor device revealed that with a HfAlON film whose Al mole fraction is within a range of $0.015 \leq Al/(Hf+Al+N) \leq 0.095$ and whose N mole fraction is within a range of $N/(Hf+Al+N) \geq 0.0450$, relative permittivity increases in comparison with a $HfO_2$ film whose $Al/(Hf+Al+N)=0$ and $N/(Hf+Al+N)=0$, and as a result, leakage current can be reduced in comparison with $HfO_2$ having the same EOT.

In addition, an evaluation by X-ray diffraction of crystalline phases of a HfAlO film whose mole fraction $Al/(Hf+Al)$ is 0.03 and a HfAlON film whose mole fractions $Al/(Hf+Al+N)$ is 0.03 and $N/(Hf+Al+N)$ is 0.08 revealed that the HfAlON has crystallized and has a crystalline phase primarily made up of cubical crystals and similar to the HfAlO.

Furthermore, a comparison of relative permittivity values and [220]/[111] peak intensity ratios of X-ray diffraction spectra of samples obtained by altering the mole fractions $Al/(Hf+Al+N)$ of a HfAlO film and a HfAlON film revealed that relative permittivity increases as the [220]/[111] peak intensity ratio increases, and a high permittivity film with a relative permittivity value approaching 50 can be obtained in a [220]/[111] peak intensity ratio region of 0.6 or greater.

As shown above, with a semiconductor device according to the present example, by using a HfAlON film having mole fractions of Hf, Al and N of $Al/(Hf+Al+N)$ ranging from 0.015 to 0.095 and of $N/(Hf+Al+N)$ equal to or greater than 0.045, a crystalline structure, preferably a crystalline structure containing cubical crystals and having a cubical crystal incorporation percentage of 80% or higher, and preferably a [220]/[111] peak intensity ratio in an X-ray diffraction spectrum of 0.6 of higher in a portion of a blocking insulating film of a MONOS non-volatile memory element, leakage current can be reduced.

Moreover, while a poly-Si film has been used as the gate electrode 408 in the present example, the same effects were achieved when using TiN, TaN, W, WN, Pt, Ir, Pt, Ta, or Ti as the gate electrode 408.

In addition, while annealing treatments of the first insulating film 403, the second insulating film 404, the third insulating film 405, the fourth insulating film 406, and the fifth insulating film 407 were performed by active annealing after ion implantation in the present example, annealing treatments may alternatively be performed after forming the respective insulating films.

Furthermore, while a laminated film made up of the third insulating film 405, the fourth insulating film 406, and the fifth insulating film 407 was used in the present example as a blocking layer of a non-volatile semiconductor memory element, the same effects were achieved using a laminated film made up of the third insulating film 405 and the fourth insulating film 406.

Fifth Example

Example Applied to FG Non-volatile Semiconductor Element

A fifth example of the present invention will now be described in detail with reference to the drawings.

Figure 18:
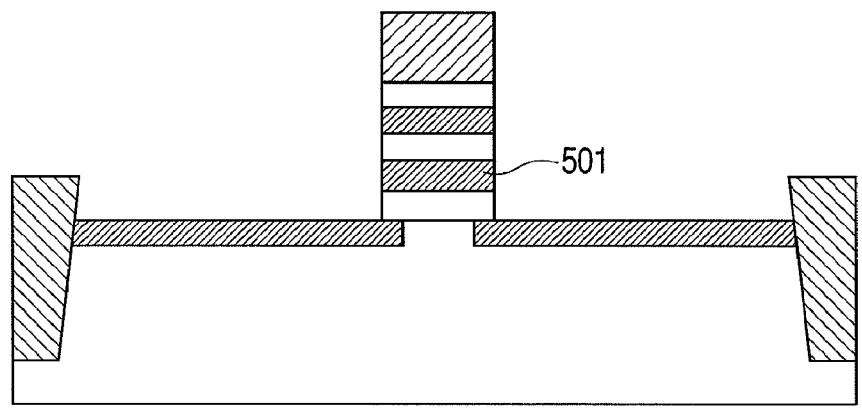
FIG. 18 is a diagram illustrating a cross-sectional structure of a semiconductor device according to a fifth example.

FIG. 18 is a cross-sectional diagram of a semiconductor device according to a fifth example of the present invention. The present example differs from the fourth example in that the second insulating film 404 of a semiconductor element in the fourth example is to be now formed of a layer made of poly-Si 501. Forming processes subsequent to the second insulating film 404 are the same as the fourth example.

An evaluation of the electrical characteristics of the fabricated semiconductor device revealed that with a HfAlON film whose Al mole fraction is within a range of $0.015 \leq Al/(Hf+Al+N) \leq 0.095$ and whose N mole fraction is within a range of $N/(Hf+Al+N) \geq 0.045$, relative permittivity increases in comparison with $HfO_2$ whose $Al/(Hf+Al+N)=0$ and $N/(Hf+Al+N)=0$, and as a result, leakage current can be reduced in comparison with $HfO_2$ having the same EOT.

In addition, an evaluation by X-ray diffraction of crystalline phases of a HfAlO film whose mole fraction $Al/(Hf+Al)$ is 0.03 and a HfAlON film whose mole fractions $Al/(Hf+Al+N)$ is 0.03 and $N/(Hf+Al+N)$ is 0.08 after annealing treatments revealed that the HfAlON has crystallized and has a crystalline phase primarily made up of cubical crystals and similar to the HfAlO.

Furthermore, a comparison of relative permittivity values and [220]/[111] peak intensity ratios of X-ray diffraction spectra of samples obtained by altering the mole fractions $Al/(Hf+Al+N)$ of a HfAlO film and a HfAlON film revealed that relative permittivity increases as the [220]/[111] peak intensity ratio increases, and a high permittivity film with a relative permittivity value of approximately 50 can be obtained in a [220]/[111] peak intensity ratio region of 0.6 or greater.

As shown above, with a semiconductor device according to the present example, by using a HfAlON film having mole fractions of Hf, Al and N of $Al/(Hf+Al+N)$ ranging from 0.015 to 0.095 and of $N/(Hf+Al+N)$ equal to or greater than 0.045, a crystalline structure, preferably a crystalline structure having a cubical crystal incorporation percentage of 80% or higher, and preferably a [220]/[111] peak intensity ratio in an X-ray diffraction spectrum of 0.6 of higher in a portion of a blocking insulating film (interpoly insulating film) of an FG non-volatile memory element having a floating electrode, leakage current can be reduced.

Moreover, while a poly-Si film has been used as a gate electrode in the present example, the same effects were achieved when using TiN, TaN, W, WN, Pt, Ir, Pt, Ta, or Ti as the gate electrode.

In addition, while annealing treatments of the first insulating film, the second insulating film (poly-Si layer 501), the third insulating film, the fourth insulating film, and the fifth insulating film were performed by active annealing after ion implantation in the present example, annealing treatments may alternatively be performed after forming the respective insulating films.

Furthermore, while a laminated film made up of the third insulating film, the fourth insulating film, and the fifth insulating film was used in the present example as a blocking layer of a non-volatile semiconductor memory element, the same effects were achieved using a laminated film made up of the third insulating film and the fourth insulating film.

Sixth Example

Example Applied to DRAM Capacitor Insulating Film

A sixth example of the present invention will now be described in detail with reference to the drawings.

FIGS. 19 to 24 are process diagrams of a semiconductor device manufacturing method according to a sixth example of the present invention.

Figure 19:
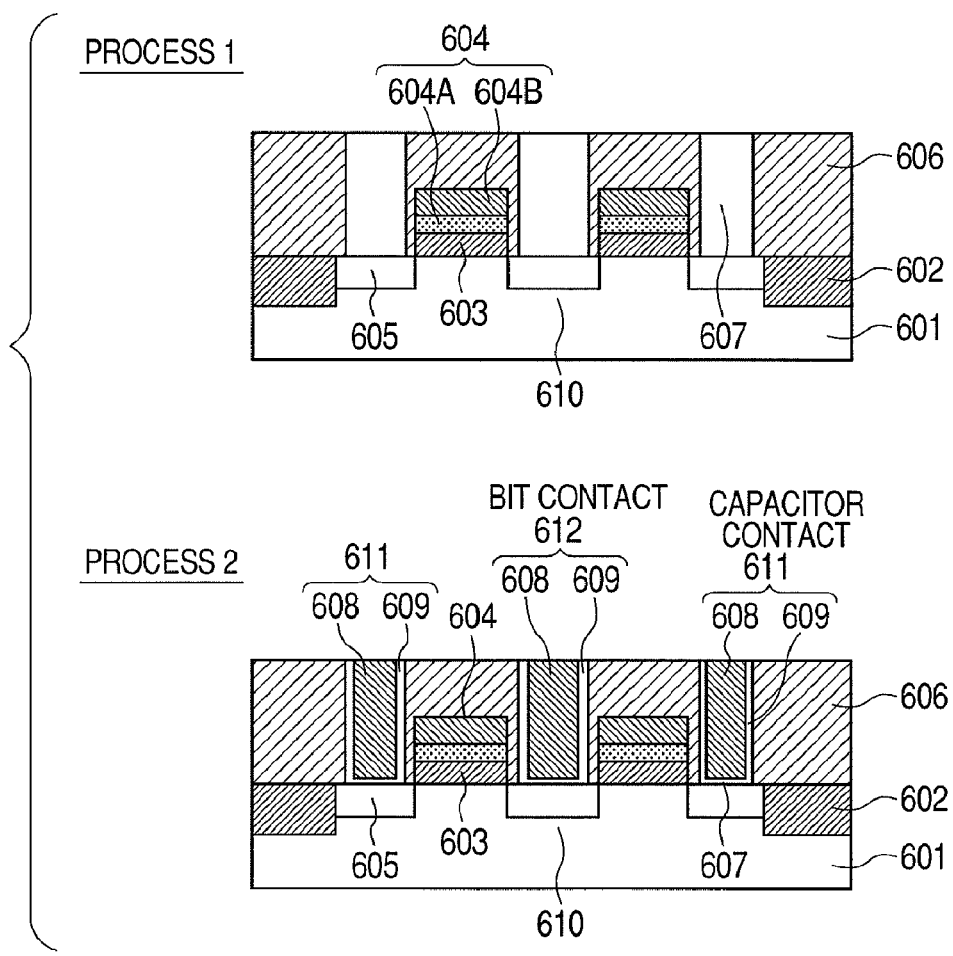
FIG. 19 is a diagram illustrating processes of a semiconductor device manufacturing method according to a sixth example.

As depicted by process 1 in FIG. 19, the substrate processing apparatus according to the present example forms an element isolation region 602 using a LOCOS (local oxidation of silicon) method or an STI method on a surface region of a P silicon substrate 601. Next, the substrate processing apparatus according to the present example sequentially deposits a silicon dioxide film (gate insulating film 603), a polycrystalline silicon film 604A, and a tungsten film 604B on an active region enclosed by the element isolation region 602, and processes a laminated film thereof using a lithographic technique and an RIE technique into a desired shape to form the gate insulating film 603 and a gate electrode 604. Subsequently, the substrate processing apparatus according to the present example performs ion implantation using the gate insulating film 603 and the gate electrode 604 as a mask, dopes an N impurity into the silicon substrate 601, and self-aligningly forms a plurality of N diffusion regions 605 to become source regions or drain regions. The substrate processing apparatus according to the present example then forms a first interlayer insulating film 606 made of a silicon dioxide film over the entire surface using a CVD method. Accordingly, a memory selecting transistor (switching element) 610 made of a MOS transistor is formed.

In this case, the aforementioned diffusion regions 605 that make up the source regions or the drain regions may have an LDD (lightly doped drain) structure that combines a high-impurity region and a low-impurity region or a non-LDD structure made of a high-impurity concentration region. In addition, a silicide layer may be formed in a source-drain region using a salicide method. In this case, from the perspective of contact resistance, Ni silicide, Co silicide, or Ti silicide may be used for the silicide layer.

Subsequently, using a lithographic method, the substrate processing apparatus according to the present example selectively etches the first interlayer insulating film 606 to form a contact hole 607 so as to expose the diffusion regions 605.

Next, as depicted by process 2 in FIG. 19, the substrate processing apparatus according to the present example forms a TiN film over the entire surface as a barrier metal 608 by a CVD method or a PVD method, and then forms a W (tungsten) film 609 over the entire surface by a CVD method. Subsequently, the substrate processing apparatus according to the present example smoothes the surface of the first interlayer insulating film 606 by a CMP (chemical mechanical polishing) method to remove unnecessary barrier metal 608 and W film 609, and forms a capacitor contact 611 and a bit contact 612 inside the contact hole 607 so as to respectively connect to the diffusion regions 605.

Figure 20:
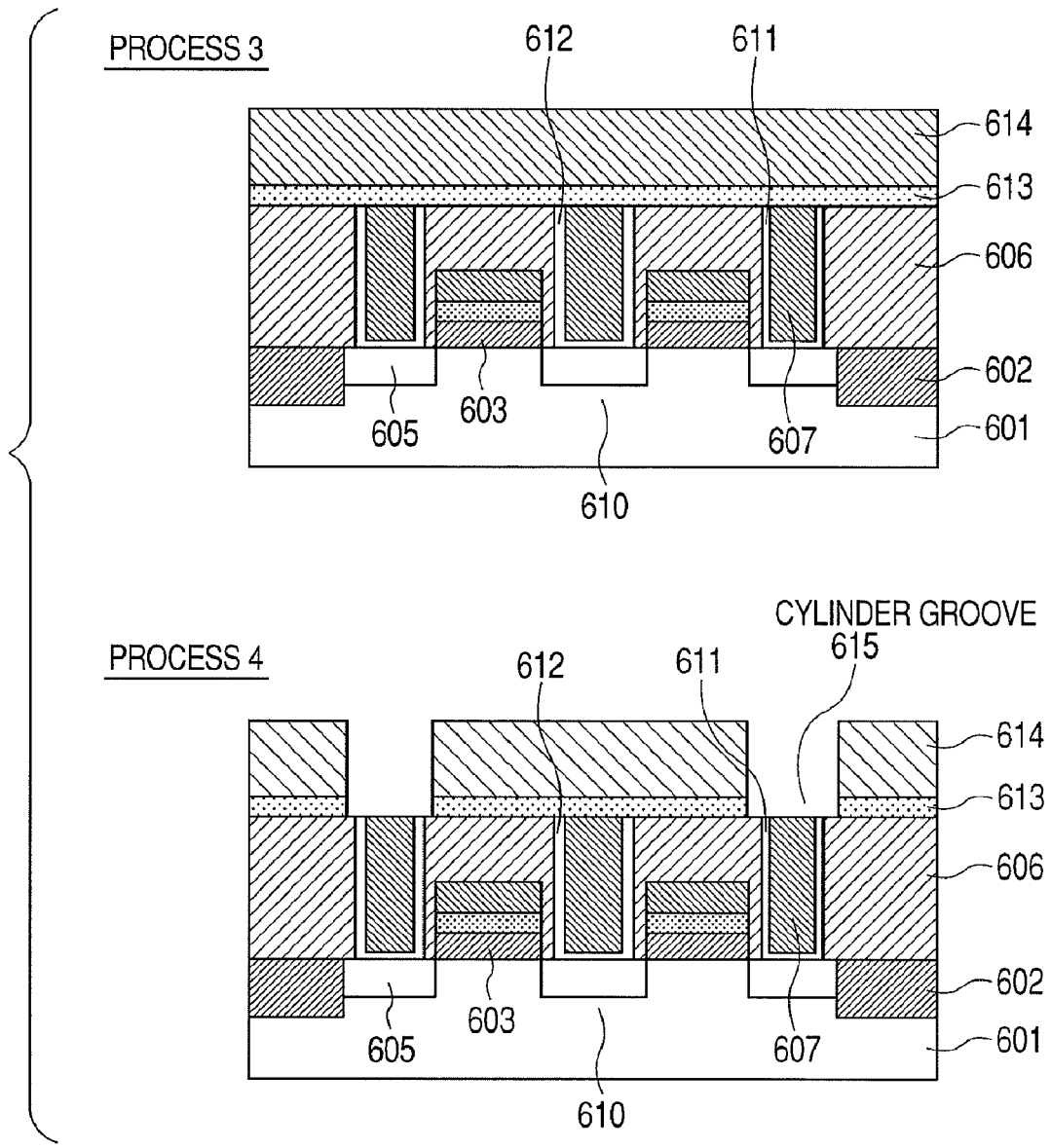
FIG. 20 is a diagram illustrating processes of a semiconductor device manufacturing method according to the sixth example.

As depicted by process 3 in FIG. 20, the substrate processing apparatus according to the present example then sequentially forms a stopper insulating film 613 made of a silicon oxynitride (SiON) film and a second interlayer insulating film 614 made of a silicon dioxide film over the entire surface by a CVD method.

Subsequently, as depicted by process 4 in FIG. 20, using a lithographic method, the substrate processing apparatus according to the present example selectively etches the second interlayer insulating film 614 to form a cylinder groove 615 so as to expose the capacitor contact 611.

Next, the substrate processing apparatus according to the present example forms a first electrode (lower electrode) 616 with a film thickness of 20 nm to 40 nm and made of a TiN film in the cylinder groove 615 by a CVD method or an ALD method, and as depicted by process 5 in FIG. 21, subsequently removes an unnecessary portion among the first electrode 616 by a lithographic method to form the first electrode 616 using an electrode film remaining in the capacitor contact 611.

Figure 21:
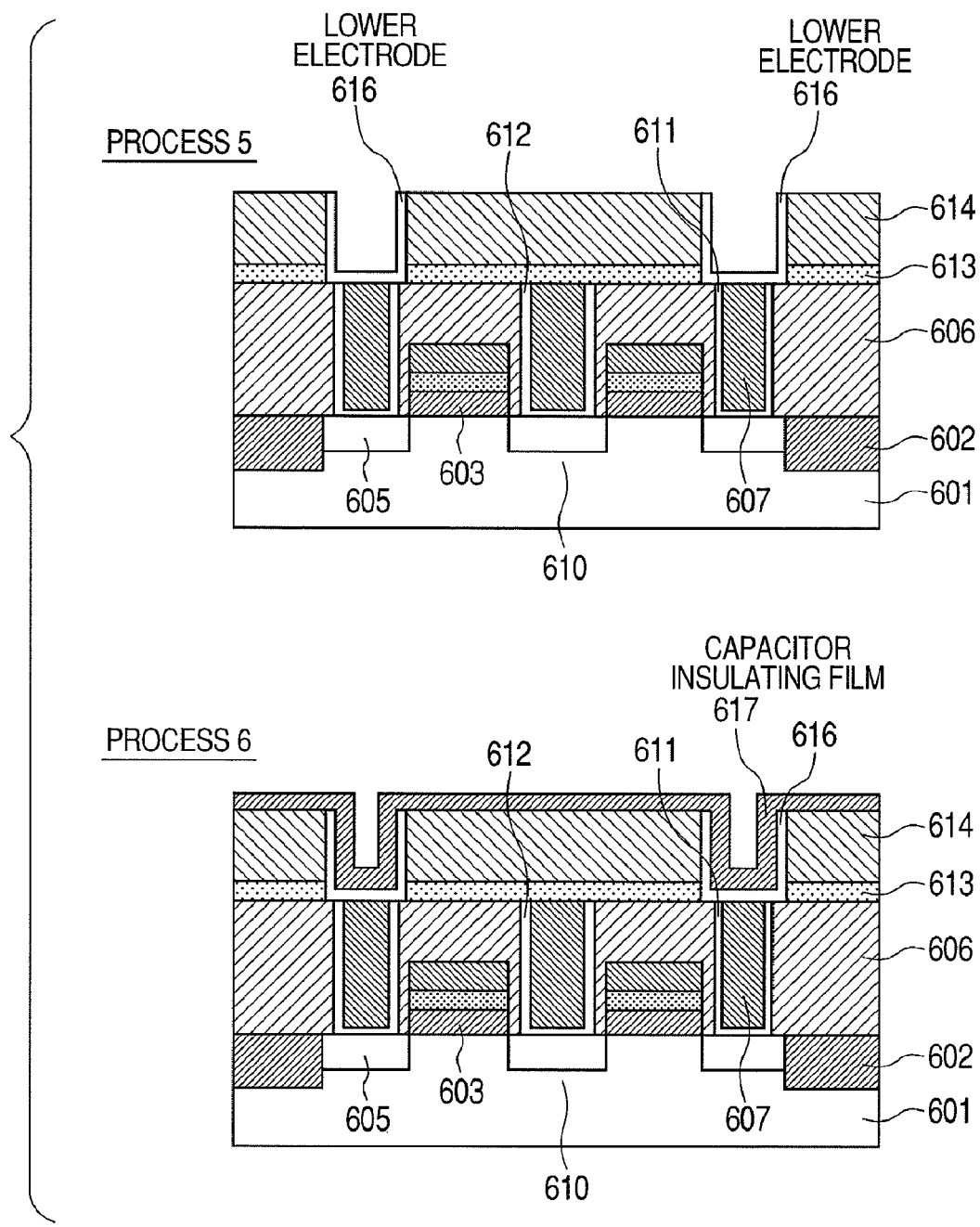
FIG. 21 is a diagram illustrating processes of a semiconductor device manufacturing method according to the sixth example.

As depicted by process 6 in FIG. 21, the substrate processing apparatus according to the present example then forms a dielectric film 617 on the first electrode 616 by an ALD method or a CVD method. In this case, the dielectric film can be formed in the same manner as in the second example. After forming the dielectric film 617, the substrate processing apparatus according to the present example performs a nitriding treatment in an $NH_3$ atmosphere at a temperature of 600° C. for 10 minutes. The formed dielectric film 617 is a HfAlON film whose Al mole fraction is within a range of $0 \leq Al/(Hf+Al+N) \leq 0.10$ and whose N mole fraction is within a range of $0 \leq N/(Hf+Al+N) \leq 0.20$. In addition, the film thickness of the formed dielectric film 617 is within a range of 5 nm to 20 nm.

Next, the substrate processing apparatus according to the present example performs an annealing treatment in a nitrogen atmosphere at 600° C. to 700° C. for 10 seconds to crystallize the dielectric film 617.

Figure 22:
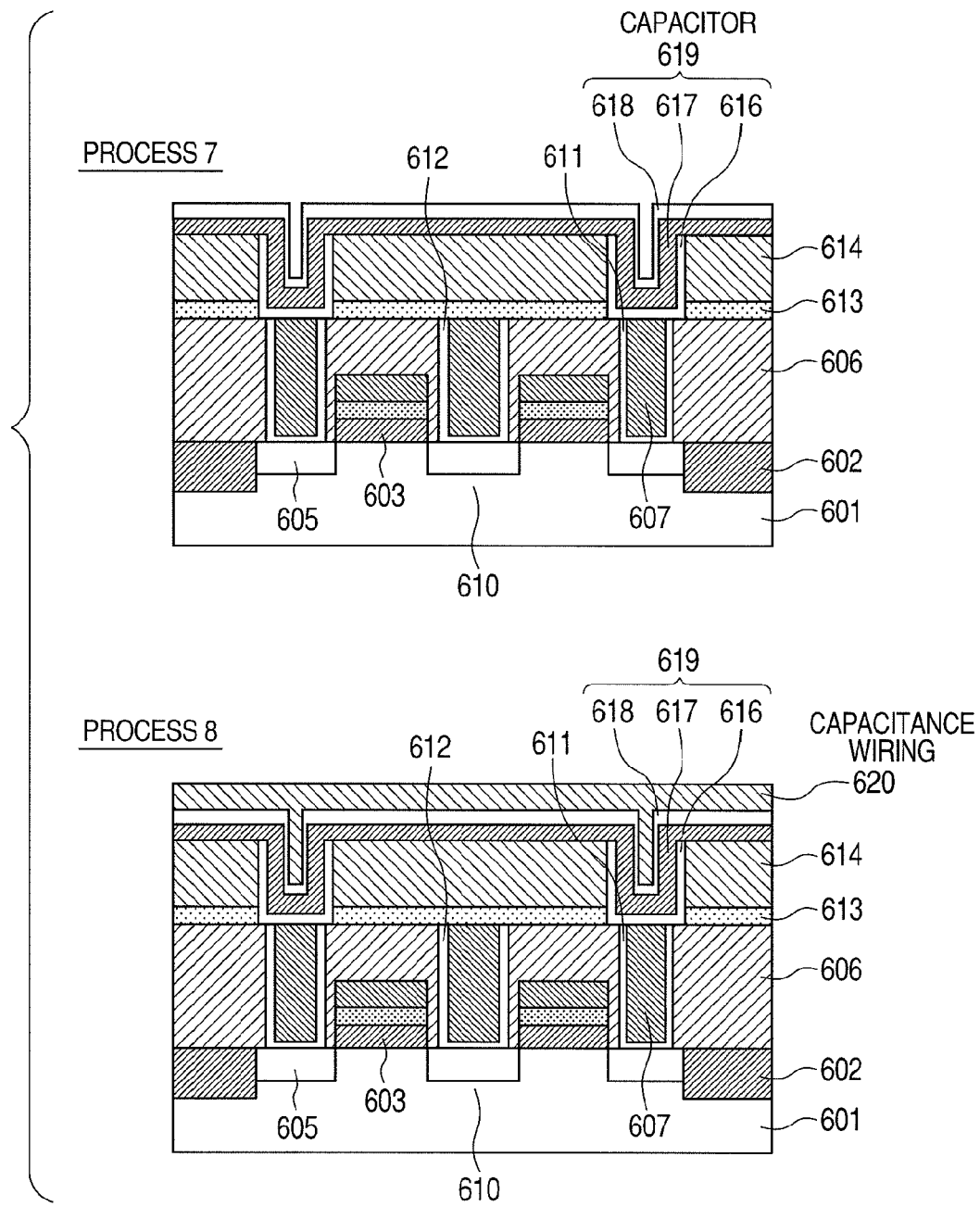
FIG. 22 is a diagram illustrating processes of a semiconductor device manufacturing method according to the sixth example.

As depicted by process 7 in FIG. 22, the substrate processing apparatus according to the present example then forms a second electrode 618 made of a TiN film by a CVD method or an ALD method. Accordingly, a capacitor 619 having an MIM structure and which includes the first electrode 616, the dielectric film 617, and the second electrode 618 is formed. From the perspective of securing capacitance, as is the case with the present example, the capacitor structure preferably has a large surface area such as a cylindrical structure in which a face of the first electrode 616 opposing the second electrode 618 and a face of the second electrode 618 opposing the first electrode 616 are formed of a plurality of faces which, in the process 7 in FIG. 22, include faces substantially parallel to the substrate and faces substantially perpendicular to the substrate.

Next, as depicted by process 8 in FIG. 22, the substrate processing apparatus according to the present example forms a capacitor (capacitance) wiring 620 made of a W film over the entire surface by a CVD method, and connects the same to the second electrode 618 of the capacitor 619. As depicted by process 9 in FIG. 23, the substrate processing apparatus according to the present example then forms an opening 621 so as to expose the second interlayer insulating film 614 above the bit contact 612.

Figure 23:
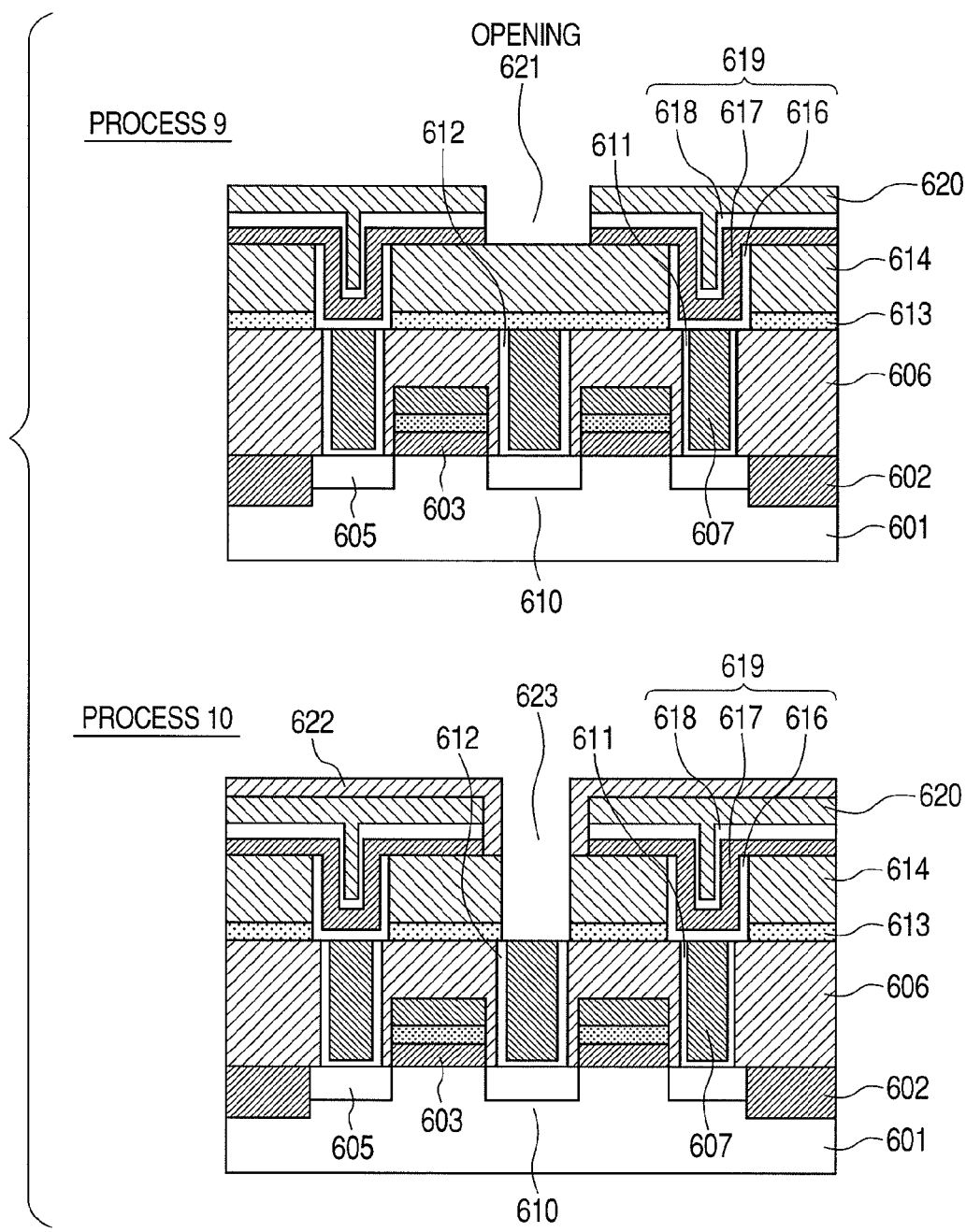
FIG. 23 is a diagram illustrating processes of a semiconductor device manufacturing method according to the sixth example.

Subsequently, as depicted by process 10 in FIG. 23, the substrate processing apparatus according to the present example forms a third interlayer insulating film 622 made of a silicon dioxide film over the entire surface by a CVD method, and using a lithographic method, selectively etches the third interlayer insulating film 622 to form a contact hole 623 inside the opening 621 so as to expose the bit contact 612.

Figure 24:
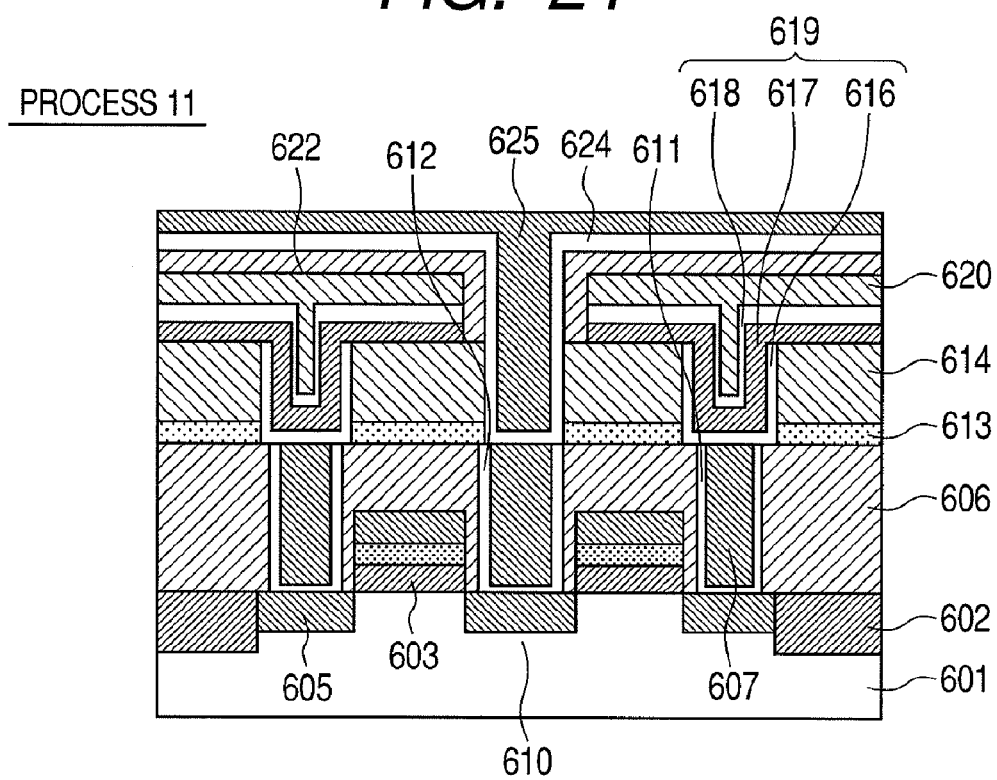
FIG. 24 is a diagram illustrating processes of a semiconductor device manufacturing method according to the sixth example.

Next, as depicted by process 11 in FIG. 24, the substrate processing apparatus according to the present example forms a TiN film as a barrier metal 624 over the entire surface by a CVD method and then a bit wiring 625 made of a W film over the entire surface by a CVD method, so that these are connected to the bit contact 612 to complete the semiconductor device.

According to a semiconductor device of the present example, it is confirmed that with a HfAlON film whose Al mole fraction is within a range of $0.015 \leq Al/(Hf+Al+N) \leq 0.095$ and whose N mole fraction is within a range of $N/(Hf+Al+N) \geq 0.045$, relative permittivity increases in comparison with $HfO_2$ whose $Al/(Hf+Al+N)=0$ and $N/(Hf+Al+N)=0$, and as a result, leakage current can be reduced in comparison with $HfO_2$ having the same EOT.

In addition, an evaluation by X-ray diffraction of crystalline phases of a HfAlO film whose mole fraction $Al/(Hf+Al)$ is 0.03 and a HfAlON film whose mole fractions $Al/(Hf+Al+N)$ is 0.03 and $N/(Hf+Al+N)$ is 0.08 revealed that the HfAlON has crystallized and has a crystalline phase primarily made up of cubical crystals and similar to the HfAlO.

Furthermore, a comparison of relative permittivity values and [220]/[111] peak intensity ratios of X-ray diffraction spectrums of samples obtained by altering the mole fractions Al/(Hf+Al+N) of a HfAlO film and a HfAlON film revealed that relative permittivity increases as the [220]/[111] peak intensity ratio increases, and a high permittivity film with a relative permittivity value approaching 50 can be obtained in a [220]/[111] peak intensity ratio region of 0.6 or greater.

As shown above, with a semiconductor device according to the present example, effects thereof can be achieved even when using a HfAlON film having mole fractions of Hf, Al and N of Al/(Hf+Al+N) ranging from 0.015 to 0.095 and of N/(Hf+Al+N) equal to or greater than 0.045, a crystalline structure, preferably a crystalline structure having a cubical crystal incorporation percentage of 80% or higher, and preferably a [220]/[111] peak intensity ratio in an X-ray diffraction spectrum of 0.6 of higher as a capacitor insulating film having a cylindrical structure.

While a MOS transistor was used as the switching element 610 in the present example, elements that function as a switching element such as other field-effect transistors can be selected and used as appropriate.

In addition, while TiN is used as the first electrode 616 and the second electrode 618 in the present example, it is confirmed that similar effects can be achieved by using a material selected from among a group made up of Ti, W, WN, Pt, Ir, Ru, Ta, and TaN as the first electrode 616. Furthermore, it is confirmed that similar effects can be achieved by using a material selected from among a group made up of Ti, W, WN, Pt, Ir, Ru, Ta, and TaN as the second electrode 618.

Figure 25:
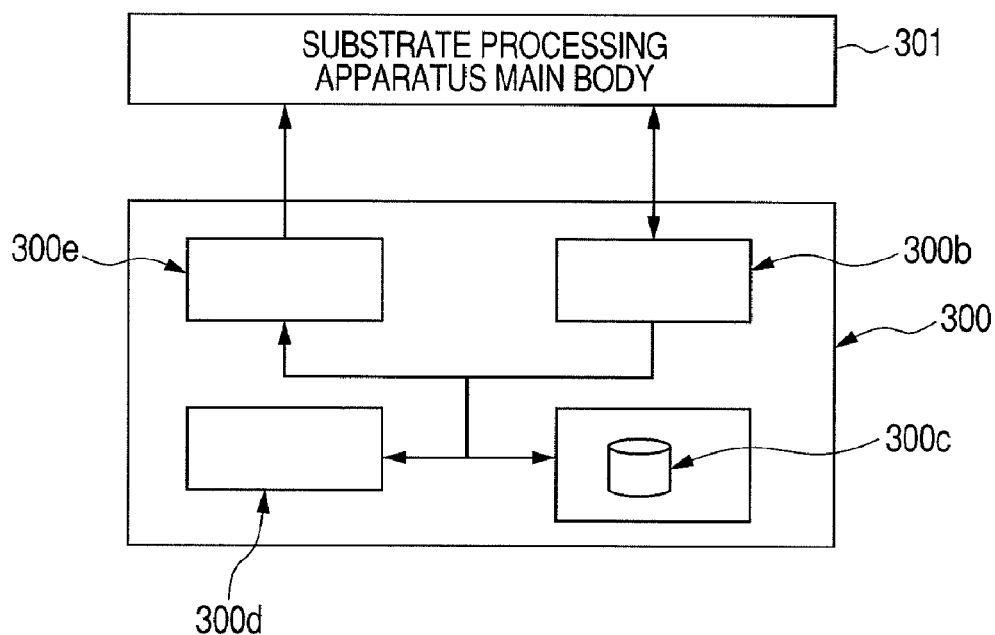
FIG. 25 is a schematic diagram illustrating a control mechanism for implementing the first to sixth examples.

FIG. 25 is a schematic diagram illustrating a control mechanism for implementing the first to sixth examples. A control mechanism 300 is connected to a substrate processing apparatus 301 capable of implementing the first to sixth examples. The control mechanism 300 includes an input unit 300b, a storage unit 300c having a program and data, a processor 300d, and an output unit 300e. The control mechanism 300 basically has a computer configuration and controls the substrate processing apparatus 301.

In FIG. 25, the substrate processing apparatus 301 can be used as the substrate processing apparatuses according to the first to sixth examples described above. Therefore, the control mechanism 300 can control operations of the substrate processing apparatus 301 by having the processor 300d execute a control program stored in the storage unit 300c. In other words, under the control of the control mechanism 300, the substrate processing apparatus 301 is capable of performing the operations described in the first to sixth examples above.

The control mechanism 300 may be provided separately from the substrate processing apparatus 301 or may be incorporated into the substrate processing apparatus 301.

It is to be understood that a processing method which causes: a storage medium to store a program that causes a configuration of the aforementioned embodiments to be operated so as to realize the functions of the aforementioned embodiments; reads out the program stored in the storage medium as a code; and executes the program on a computer is also included in the scope of the aforementioned embodiments. In other words, a computer-readable storage medium is also included in the scope of the embodiments. Furthermore, in addition to a storage medium storing the computer program described above, the computer program itself is also included in the scope of the aforementioned embodiments.

For example, a floppy (registered trademark) disk, a hard disk, an optical disk, a magnetooptic disk, a CD-ROM, a magnetic tape, a non-volatile memory card, and a ROM can be used as the storage medium.

Moreover, in addition to an arrangement in which processing is single-handedly executed by a program stored in the storage medium described above, an arrangement in which the program runs on an OS in cooperation with functions of other software and expansion boards to execute the operations of the aforementioned embodiments is also included in the scope of the aforementioned embodiments.

The invention claimed is:

1. A dielectric film comprising a composite oxynitride containing an element A being Hf, an element B being Al or Si, and N and O,
   wherein mole fraction of the element A, the element B, and N expressed as B/(A+B+N) ranges from 0.015 to 0.095 and mole fraction of the element A, the element B, and N expressed as N/(A+B+N) is equal to or less than 0.2, and the dielectric film has a crystalline structure.

2. The dielectric film according to claim 1, wherein the crystalline structure contains cubical crystals, and the incorporation percentage of the cubical crystals of the crystalline structure is equal to or greater than 80%.

3. The dielectric film according to claim 1, wherein a value of [220]/[111] that is a ratio of a peak intensity of [220] to a peak intensity of [111] in an X-ray diffraction spectrum is equal to or greater than 0.6.

4. The dielectric film according to claim 1, wherein a relative permittivity thereof is equal to or greater than 40.

5. The dielectric film according to claim 1, wherein the dielectric film is subjected to a heat treatment at a temperature of 1200° C. or lower.

6. A semiconductor device having a dielectric film as an insulating film, wherein the dielectric film is the dielectric film according to claim 1.

7. A non-volatile semiconductor device comprising:
   a substrate with at least a surface including a semiconductor layer;
   a gate electrode formed on the substrate; and
   a laminated gate insulating film sequentially laminated between the substrate and the gate electrode,
   wherein at least one layer among the insulating films that make up the laminated gate insulating film is the dielectric film according to claim 1.

8. A non-volatile semiconductor device comprising:
   a substrate with at least a surface including a semiconductor layer;
   a gate electrode formed on the substrate; and
   a structure in which an insulating film, a floating electrode, and an insulating film are laminated in sequence between the substrate and the gate electrode,
   wherein at least a portion of the insulating films formed between the gate electrode and the floating electrode is the dielectric film according to claim 1.

9. A semiconductor device having, on a substrate with at least a surface including a semiconductor layer, a source region, a drain region, and a gate electrode formed via an insulating film, wherein the insulating film is a film including the dielectric film according to claim 1.

10. A semiconductor device comprising a capacitor, the capacitor including:
    a first electrode;
    a second electrode; and
    a layer including a dielectric film sandwiched between the first electrode and the second electrode,
    wherein the dielectric film is the dielectric film according to claim 1.

11. The semiconductor device according to claim 10, wherein the capacitor and a switching element which is formed on a substrate with at least a surface including a semiconductor layer are electrically connected.

12. The semiconductor device according to claim 10, wherein a face of the first electrode opposing the second electrode and a face of the second electrode opposing the first electrode respectively include a plurality of faces.

13. A capacitor comprising:
a first electrode;
a second electrode; and
a layer including a dielectric film sandwiched between the first electrode and the second electrode,
wherein the dielectric film is the dielectric film according to claim 1.

14. The dielectric film according to claim 1, wherein the mole fraction of the element A, the element B, and N expressed as B/(A +B +N) ranges from 0.02 to 0.07.

15. The dielectric film according to claim 1, wherein the element B is Al.

16. The dielectric film according to claim 1, wherein the mole fraction of the element A, the element B, and N expressed as B/(A +B +N) ranges from 0.025 to 0.08.

17. A dielectric film comprising a composite oxynitride containing an element A being Hf, an element B being Al or Si, and N and O,
wherein mole fraction of the element A, the element B, and N expressed as B/(A +B +N) ranges from 0.015 to 0.095 and mole fraction of the element A, the element B, and N expressed as N/(A +B +N) equals or exceeds 0.045, and wherein the dielectric film is subjected to a heat treatment at a temperature of 850° C. or higher and 1200° C. or lower, the dielectric film has a crystalline structure, the incorporation percentage of cubical crystals of the crystalline structure is greater than the incorporation percentage of tetragonal crystals of the crystalline structure, and the incorporation percentage of cubical crystals of the crystalline structure is equal to 80% or higher.

* * * * *